US012707853B2

(12) United States Patent
Park

(10) Patent No.: US 12,707,853 B2
(45) Date of Patent: Aug. 11, 2026

(54) DISPLAY PANEL AND DISPLAY DEVICE COMPRISING THE SAME

(71) Applicant: LG Display Co., Ltd., Seoul (KR)

(72) Inventor: Won Young Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 659 days.

(21) Appl. No.: 17/970,823

(22) Filed: Oct. 21, 2022

(65) Prior Publication Data

US 2023/0157128 A1 May 18, 2023

(30) Foreign Application Priority Data

Nov. 15, 2021 (KR) ........................ 10-2021-0156795

(51) Int. Cl.
*H10K 59/40* (2023.01)
*H10K 50/84* (2023.01)
(Continued)

(52) U.S. Cl.
CPC ............. *H10K 59/40* (2023.02); *H10K 50/84* (2023.02); *H10K 59/126* (2023.02); *H10K 59/65* (2023.02)

(58) Field of Classification Search
CPC ........ H10K 59/40; H10K 59/60; H10K 59/65; H10K 2102/351
See application file for complete search history.

(56) References Cited

U.S. PATENT DOCUMENTS

2020/0057529 A1* 2/2020 Zhang .................... H10K 59/40
2021/0091165 A1 3/2021 Jeon et al.
(Continued)

FOREIGN PATENT DOCUMENTS

CN 111180486 A 5/2020
CN 112542493 A 3/2021
(Continued)

*Primary Examiner* — Aaron J Gray
(74) *Attorney, Agent, or Firm* — Birch, Stewart, Kolasch & Birch, LLP

(57) ABSTRACT

A display device a display panel including a plurality of light emitting areas; and a first optical electronic device located under the display panel. Further, a first optical area of the display panel overlapping the first optical electronic device comprises a plurality of first light transmission areas in addition to the plurality of light emitting areas, and a third optical area of the display panel not overlapping the first optical electronic device includes the plurality of light emitting areas without including the first light transmission areas. The display panel also includes organic light emitting elements disposed in the first optical area and the third optical area and corresponding to the light emitting areas; an encapsulation layer disposed on the organic light emitting elements; a first insulating layer disposed on the encapsulation layer; a touch sensor disposed on the first insulating layer; and a second insulating layer disposed on the touch sensor. In addition, a thickness of the first insulating layer in the third optical area is smaller than a thickness of the second insulating layer in the third optical area, and the thickness of the first insulating layer in the first optical area is smaller than the thickness of the second insulating layer in the first optical area, and the thickness of the first insulating layer disposed in the third optical area is greater than the thickness of the first insulating layer disposed in the first optical area, and the thickness of the second insulating layer disposed in the third optical area is greater than the thickness of the second insulating layer disposed in the first optical area.

20 Claims, 18 Drawing Sheets

(51) Int. Cl.
*H10K 59/126* (2023.01)
*H10K 59/65* (2023.01)

(56) References Cited

U.S. PATENT DOCUMENTS

2021/0191552 A1* 6/2021 Bok ........................ G09G 3/32
2021/0303125 A1 9/2021 Jang et al.

FOREIGN PATENT DOCUMENTS

KR 10-2020-0037029 A 4/2020
KR 10-2020-0071189 A 6/2020
KR 10-2021-0086907 A 7/2021
KR 10-2021-0130893 A 11/2021

* cited by examiner

OA1
TA1
TA1
OA2
TA2
TA2
NA
EA
EA of Red SP
EA of Green SP
EA of Blue SP
OA1
OA2
NA
NA
HA1
HA2

HL1
HL2
VLn
OA1
TA1
VL1
TA1
VLn
HA1
HA2

FIG. 13

| | | Comparative Example 1 | Example 1 | Comparative Example 2 | Example 2 |
|---|---|---|---|---|---|
| $NH_3/NH_4$ | Flow rate | 0.93 | | 1.19 | |
| Thickness in the first optical area | First insulating layer | 4000Å | 3000Å | 4000Å | 3000Å |
| | Second insulating layer | 2000Å | 1300Å | 2000Å | 1300Å |
| Yellow Index | | 71.13 | 64.18 | 65.57 | 62.23 |
| Transmittance | Light having a wavelength of 430nm | 2.5% | 2.8% | 2.7% | 2.9% |
| | Light having a wavelength of 470nm | 6.6% | 6.7% | 6.5% | 7.0% |

DISPLAY PANEL AND DISPLAY DEVICE COMPRISING THE SAME

CROSS-REFERENCE TO RELATED APPLICATION

This application claims the priority benefit of Republic of Korea Patent Application No. 10-2021-0156795, filed on Nov. 15, 2021, in the Korean Intellectual Property Office, the entire contents of which are hereby incorporated by reference in its entirety into the present application.

BACKGROUND OF THE DISCLOSURE

Technical Field

The present disclosure relates to electronic devices, and more particularly, to a display panel for improving the transmittance of an area in which an optical device is disposed, and a display device including the display panel.

Description of the Related Art

Display devices provide functions such as an image capture function, a sensing function, and the like, in addition to an image display function. The display device thus includes an optical electronic device, such as a camera, a sensor for detecting an image, etc. To receive light passing through a front surface of a display device, the optical electronic device is located in an area of the display device where incident light coming from the front surface can be advantageously received or detected. To install the optical electronic device in such an implementation, the bezel of the display device is increased, and a notch or a hole is formed in a display area of the display device.

SUMMARY OF THE DISCLOSURE

Accordingly, one aspect of the present disclosure is to address the above noted and other problems of the related art.

Another aspect of the present disclosure is to provide a display device with one or more optical electronic devices located in a display device without reducing an area of a display area.

Another aspect of the present disclosure is to provide a display device including an optical electronic device located under a display area of the display panel and that is not visible or exposed in the front surface of the display device.

Still another aspect of the present disclosure is to provide a display device including an optical electronic device in a display area having a high transmittance.

Another aspect of the present disclosure is to provide a display panel and a display device for reducing a non-display area of the display panel and enabling an optical electronic device such as a camera, a sensor, and/or the like from not to be exposed in the front surface of the display panel by disposing the optical electronic device under a display area, or at a lower portion, of the display panel.

The present disclosure also provides a display panel and a display device having a light transmission structure for enabling the optical electronic device to normally receive or detect light transmitting the display panel.

To achieve these and other objects, the present disclosure provides a display device including a display panel including a display area including a first optical area and a normal area that is located outside of the first optical area, and a non-display area, wherein the first optical area includes a plurality of light emitting areas and a plurality of first transmission areas, and the normal area includes a plurality of light emitting areas; and a first optical electronic device that is located under, or in a lower portion of, the display panel and overlaps at least a portion of the first optical area included in the display area. The display panel includes organic light emitting elements disposed in the first optical area and the normal area, an encapsulation layer disposed on at least one of the organic light emitting elements, a first insulating layer disposed on the encapsulation layer, a touch sensor disposed on the first insulating layer, and a second insulating layer disposed on the touch sensor. Respective thicknesses of the first insulating layer in the normal area and the first optical area are smaller than respective thicknesses of the second insulating layer in the normal area and the first optical are. The thickness of the first insulating layer disposed in the normal area is greater than the thickness of the first insulating layer disposed in the first optical area. The thickness of the second insulating layer disposed in the normal area is also greater than the thickness of the second insulating layer disposed in the first optical area.

The present disclosure also provides a display panel including a substrate including a display area and a non-display area, organic light emitting elements disposed over the substrate in a first optical area and a normal area, an encapsulation layer disposed on at least one of the organic light emitting elements, a first insulating layer disposed on the encapsulation layer, a touch sensor disposed on the first insulating layer, and a second insulating layer disposed on the touch sensor. The display area includes the first optical area at least partially overlapping a first optical electronic device located under the substrate, and the normal area located outside of the first optical area. Respective thicknesses of the first insulating layer in the normal area and the first optical area are smaller than respective thicknesses of the second insulating layer in the normal area and the first optical are. The thickness of the first insulating layer disposed in the normal area is greater than the thickness of the first insulating layer disposed in the first optical area. The thickness of the second insulating layer disposed in the normal area is greater than the thickness of the second insulating layer disposed in the first optical area.

Thus, a display panel and a display device can be provided that reduces a non-display area of a display panel and enables an optical electronic device not to be exposed in the front surface of the display panel by disposing the optical electronic device under a display area, or in a lower portion, of the display panel.

Further, a display panel and a display device are provided that have a light transmission structure in which an optical electronic device located under a display area, or in a lower portion, of a display panel has a capability of normally receiving or detecting light. Also, a display panel and a display device can be provided that are for normally performing display driving in an optical area included in a display area of a display panel and overlapping an optical electronic device.

In addition, a display panel and a display device can be provided that have a structure in which an area where an optical electronic device is disposed is configured to have a high transmittance and is for forming this structure through a simple process.

Additional features and an aspect will be set forth in part in the description which follows and in part will become apparent from the description or can be learned by practice of the inventive concepts provided herein. Other features and an aspect of the inventive concepts can be realized and attained by the structure particularly pointed out in, or derivable from, the written description, the claims hereof, and the appended drawings.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the appended claims. Nothing in this section should be taken as a limitation on those claims. It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of the disclosure, illustrate an aspect of the disclosure and together with the description serve to explain principles of the disclosure. In the drawings:

FIG. 13 is a table representing yellow indexes and transmittances in short wavelengths of display devices between Comparative Examples 1 and 2 and Examples 1 and 2.

DETAILED DESCRIPTION OF THE EMBODIMENTS

Figure 1A:
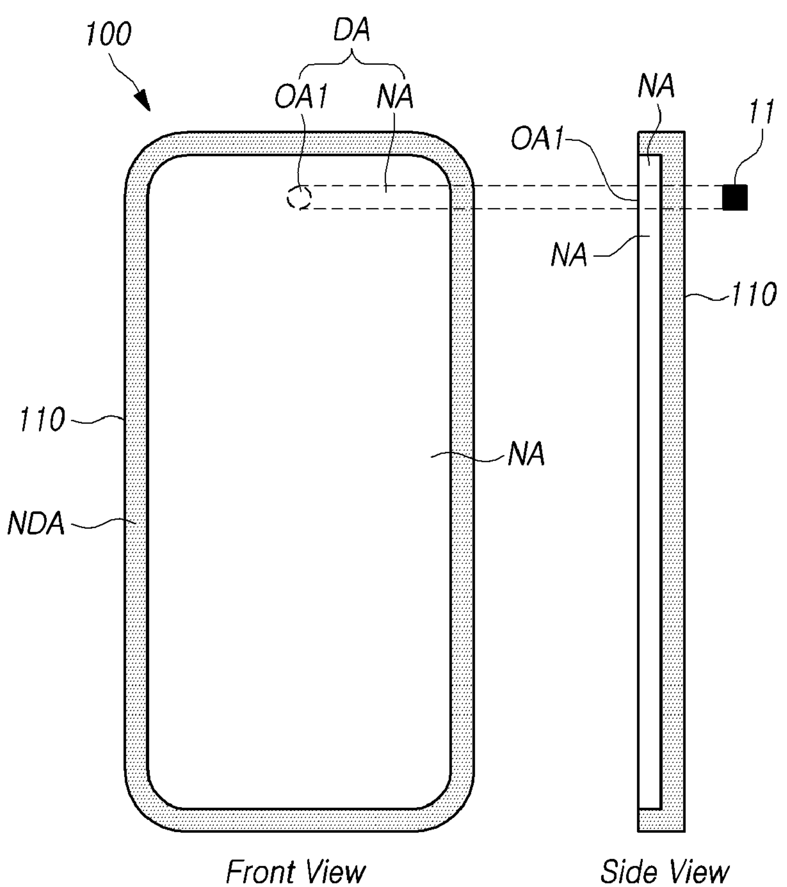
FIGS. 1A, 1B, 1C and 1D are plan views illustrating a display device according to an aspect of the present disclosure.

Reference will now be made in detail to embodiments of the present disclosure, examples of which are illustrated in the accompanying drawings. In the following description, the structures, embodiments, implementations, methods and operations described herein are not limited to the specific example or examples set forth herein and can be changed as is known in the art, unless otherwise specified. Names of the respective elements used in the following explanations are selected only for convenience of writing the specification and may thus be different from those used in actual products.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals designate like elements throughout, unless otherwise specified. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure an aspect of the present disclosure, a detailed description of such known function or configuration can be omitted. Where the terms "comprise," "have," "include," "contain," "constitute," "make up of," "formed of," and the like are used, one or more other elements can be added unless the term, such as "only," is used. An element described in the singular form is intended to include a plurality of elements, and vice versa, unless the context clearly indicates otherwise. Singular forms used herein are intended to include plural forms unless the context clearly indicates otherwise.

In construing an element, the element is to be construed as including an error or tolerance range even where no explicit description of such an error or tolerance range is provided. Where positional relationships are described, for example, where the positional relationship between two parts is described using "on," "over," "under," "above," "below," "beside," "next," or the like, one or more other parts can be located between the two parts unless a more limiting term, such as "immediate(ly)," "direct(ly)," or "close(ly)" is used. For example, where an element or layer is disposed "on" another element or layer, a third element or layer can be interposed therebetween. Furthermore, the terms "left," "right," "top," "bottom, "downward," "upward," "upper," "lower," and the like refer to an arbitrary frame of reference. Time relative terms, such as "after", "subsequent to", "next to", "before", or the like, used to describe a temporal relationship between events, operations, or the like are generally intended to include events, situations, cases, operations, or the like that do not occur consecutively unless the terms, such as "directly", "immediately", or the like, are used.

In describing a temporal relationship, when the temporal order is described as, for example, "after," "subsequent," "next," or "before," a case which is not continuous can be included unless a more limiting term, such as "just," "immediate(ly)," or "direct(ly)," is used. Although the terms "first," "second," A, B, (a), (b), and the like can be used herein to describe various elements, these elements should not be interpreted to be limited by these terms as they are not used to define a particular order or precedence. These terms are merely used herein for distinguishing an element from other elements. The expression of a first element, a second elements "and/or" a third element should be understood as one of the first, second and third elements or as any or all combinations of the first, second and third elements.

By way of example, A, B and/or C can refer to only A, only B, or only C; any or some combination of A, B, and C; or all of A, B, and C. Therefore, a first element mentioned below can be a second element in a technical concept of the present disclosure. Further, the term "may" fully encompasses all the meanings of the term "can."

The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Hereinafter, with reference to the accompanying drawings, various embodiments of the present disclosure will be described in detail. In particular, FIGS. 1A-1D are plan views illustrating a display device 100 according to an aspect of the present disclosure. Referring to FIGS. 1A-1D, the display device 100 includes a display panel 110 for displaying images, and one or more optical electronic devices 11 and/or 12.

As shown, the display panel 110 includes a display area DA in which an image is displayed and a non-display area NDA in which an image is not displayed. A plurality of subpixels are also arranged in the display area DA, and several types of signal lines for driving the subpixels are arranged therein.

The non-display area NDA refers to an area outside of the display area DA. Further, several types of signal lines can be arranged in the non-display area NDA, and several types of driving circuits can be connected thereto. At least a portion of the non-display area NDA can also be bent to be invisible from the front of the display panel or can be covered by a case of the display panel 110 or the display device 100. The non-display area NDA can also be also referred to as a bezel or a bezel area.

Referring to FIGS. 1A-1D, the optical electronic devices 11 and/or 12 are located under, or in a lower portion of, the display panel 110 (an opposite side to the viewing surface thereof). Light can thus enter the front surface (viewing surface) of the display panel 110, pass through the display panel 110, and reach one or more optical electronic devices 11 and/or 12 located under, or in the lower portion of, the display panel 110 (the opposite side of the viewing surface).

The optical electronic devices 11 and/or 12 can thus receive or detect light transmitting through the display panel 110 and perform a predefined function based on the received light. For example, the optical electronic devices 11 and/or 12 can include an image capture device such as a camera (an image sensor), and/or the like and a sensor such as a proximity sensor, an illuminance sensor, and/or the like.

Referring to FIGS. 1A-1D, the display area DA includes optical areas OA1 and/or OA2 and a normal area NA. Herein, the term "normal area" NA is an area that while being provided in the display area DA, does not overlap with optical electronic devices 11 and/or 12 and can also be referred to as a non-optical area.

Referring to FIGS. 1A-1D, the optical areas OA1 and/or OA2 can be one or more areas overlapping the optical electronic devices 11 and/or 12. According to an example of FIG. 1A, the display area DA can include a first optical area OA1 and a normal area NA. In this example, at least a portion of the first optical area OA1 can overlap a first optical electronic device 11.

Figure 1B:
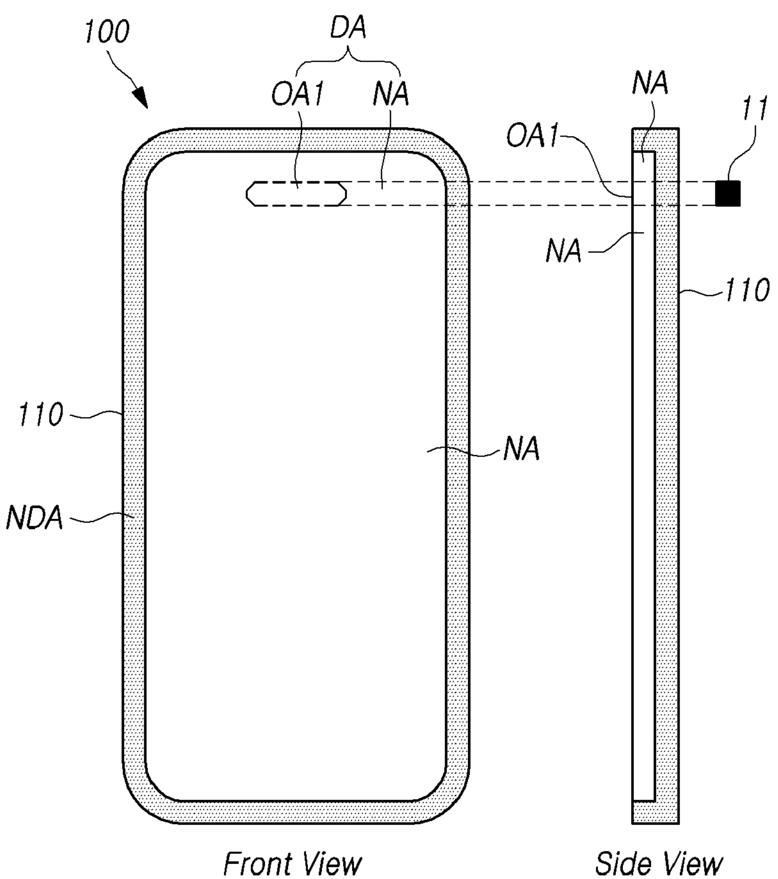

Although FIG. 1A illustrates the first optical area OA1 has a circular shape, the shape of the first optical area OA1 is not limited thereto. For example, as shown in FIG. 1B, the first optical area OA1 can have an octagonal shape, or various polygonal shapes.

Figure 1C:
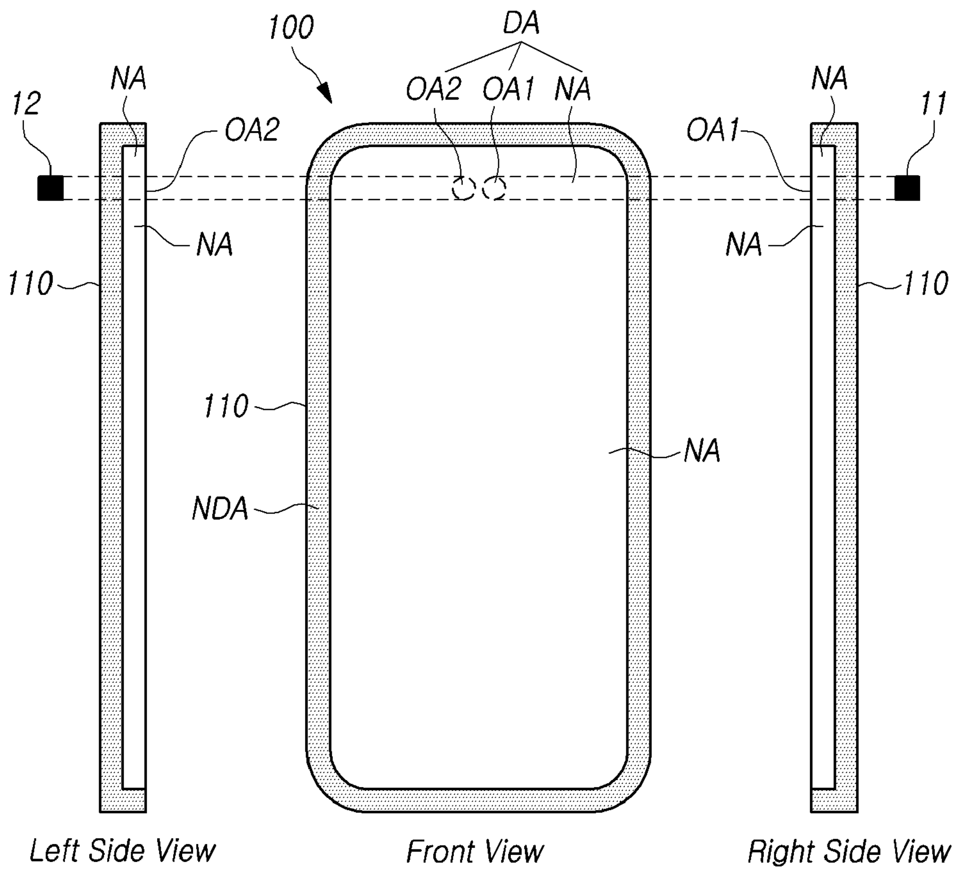

According to an example of FIG. 1C, the display area DA includes a first optical area OA1, a second optical area OA2, and a normal area NA. In FIG. 1C, at least a portion of the normal area NA can be provided between the first and second optical areas OA1 and OA2. In this example, at least a portion of the first optical area OA1 can overlap the first optical electronic device 11, and at least a portion of the second optical area OA2 may overlap a second optical electronic device 12.

Figure 1D:
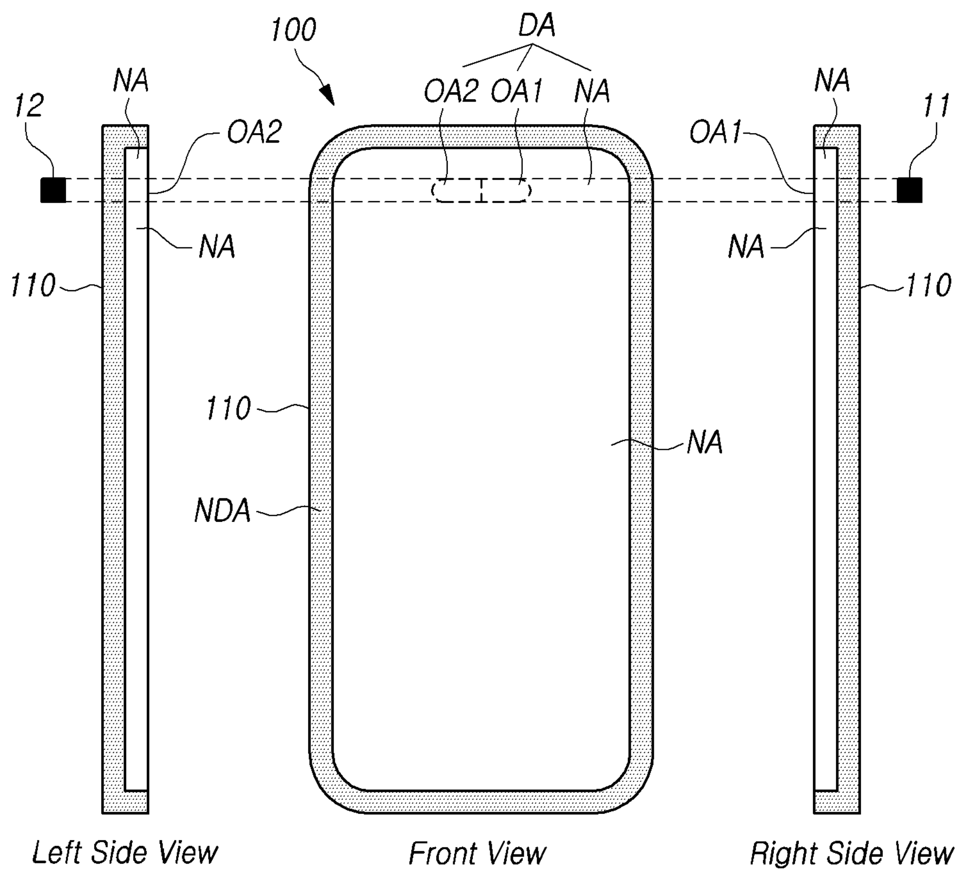

According to an example of FIG. 1D, the display area DA includes a first optical area OA1, a second optical area OA2, and a normal area NA. In the example of FIG. 1D, the normal area NA is not provided between the first and second optical areas OA1 and OA2. For example, the first and second optical areas OA1 and OA2 can contact each other (e.g., directly contact each other). In this example, at least a portion of the first optical area OA1 can overlap the first optical electronic device 11, and at least a portion of the second optical area OA2 can overlap the second optical electronic device 12.

In addition, an image display structure and a light transmission structure are preferably formed in the optical areas OA1 and/or OA2. For example, because the optical areas OA1 and/or OA2 are a portion of the display area DA, subpixels for displaying an image are included in the optical areas OA1 and/or OA2. Further, to enable light to transmit to the optical electronic devices 11 and/or 12, a light transmission structure is formed in the optical areas OA1 and/or OA2.

Even though the optical electronic devices 11 and/or 12 are needed to receive or detect light, the optical electronic devices 11 and/or 12 can be located on the back of the display panel 110 (e.g., on an opposite side of a viewing surface). In this embodiment, the optical electronic devices 11 and/or 12 are located, for example, under, or in a lower portion of, the display panel 110, and are configured to receive light that has transmitted through the display panel 110.

For example, the optical electronic devices 11 and/or 12 are not exposed in the front surface (viewing surface) of the display panel 110. Accordingly, when a user looks at the front of the display device 110, the optical electronic devices 11 and/or 12 are not visible to the user.

Further, the first optical electronic device 11 can be a camera, and the second optical electronic device 12 can be a sensor such as a proximity sensor, an illuminance sensor, an infrared sensor, and/or the like. For example, the camera can be a camera lens, an image sensor, or a unit including at least one of the camera lens and the image sensor. The sensor can be, for example, an infrared sensor for detecting infrared rays. In another embodiment, the first optical electronic device 11 can be a sensor, and the second optical electronic device 12 can be a camera.

The following descriptions refers to the first optical electronic device 11 as a camera, and the second optical electronic device 12 as a sensor. However, the first optical electronic device 11 can be the sensor, and the second optical electronic device 12 can be the camera. As described above, the camera can be a camera lens, an image sensor, or a unit including at least one of the camera lens and the image sensor.

When the first optical electronic device 11 is a camera, the camera can be located on the back of (e.g., under, or in a lower portion of) the display panel 110, and be a front camera for capturing objects or images in a front direction of the display panel 110. Accordingly, the user can capture an image or object through the camera that is invisible on the viewing surface of the display panel 110.

Although the normal area NA and the optical areas OA1 and/or OA2 included in the display area DA in FIGS. 1A-1D are areas where images can be displayed, the light transmission structure can be omitted in the normal area NA, but disposed in the optical areas OA1 and/or OA2. Thus, the normal area NA is an area where a light transmission structure is not implemented or included, and the optical areas OA1 and/or OA2 are areas in which the light transmission structure is implemented or included.

Accordingly, the optical areas OA1 and/or OA2 can have a transmittance greater than or equal to a predetermined level, i.e., a relatively high transmittance, and the normal area NA has a light transmittance less than the predetermined level i.e., a relatively low transmittance. For example, the optical areas OA1 and/or OA2 can have a resolution, a subpixel arrangement structure, the number of subpixels per unit area, an electrode structure, a line structure, an electrode arrangement structure, a line arrangement structure, or/and the like different from that/those of the normal area NA.

In one embodiment, the number of subpixels per unit area in the optical areas OA1 and/or OA2 can be smaller than the number of subpixels per unit area in the normal area NA. For example, the resolution of the optical areas OA1 and/or OA2 can be lower than that of the normal area NA. Here, the number of subpixels per unit area includes a unit for measuring resolution, for example, referred to as pixels (or subpixels) per inch (PPI), which represents the number of pixels within 1 inch.

Also, in FIGS. 1A-1D, the number of subpixels per unit area in the first optical areas OA1 can be smaller than the number of subpixels per unit area in the normal area NA. In FIGS. 1C and 1D, the number of subpixels per unit area in the second optical areas OA2 can be greater than or equal to the number of subpixels per unit area in the first optical areas OA1.

Further, the first optical area OA1 can have various shapes, such as a circle, an ellipse, a quadrangle, a hexagon, an octagon or the like. In addition, the second optical area OA2 can have various shapes, such as a circle, an ellipse, a quadrangle, a hexagon, an octagon or the like. The first and second optical areas OA1 and OA2 can also have the same shape or different shapes. Referring to FIG. 1C, when the first and second optical areas OA1 and OA2 contact each other, the entire optical area including the first and second optical areas OA1 and OA2 can also have various shapes, such as a circle, an ellipse, a quadrangle, a hexagon, an octagon or the like.

Hereinafter, the description is based on embodiments in which each of the first and second optical areas OA1 and OA2 has a circular shape. However, one or both of the first and second optical areas OA1 and OA2 can have a shape other than a circular shape.

In addition, as described above, the first optical electronic device 11 is located to be covered under, or in the lower portion of, the display panel 110 without being exposed to the outside. In addition, the first optical electronic device 11 is referred to as a camera. This arrangement can be referred to as an under-display camera (UDC) technology.

Also, the display device 100 according to this configuration has an advantage of increasing the size of the display area DA because a notch or a camera hole for exposing a camera need not be formed in the display panel 110. The size of the bezel area can also be reduced, and the degree of freedom in design can be improved.

Although the optical electronic devices 11 and/or 12 are located to be covered on the back of (under, or in the lower portion of) the display panel 110 in the display device 100 according to an aspect of the present disclosure, that is, hidden not to be exposed to the outside, the optical electronic devices 11 and/or 12 still need to receive or detect light for normally performing functionality. Further, image display needs to be normally performed in the optical areas OA1 and/or OA2 overlapping the optical electronic devices 11 and/or 12 in the area DA.

Figure 2:
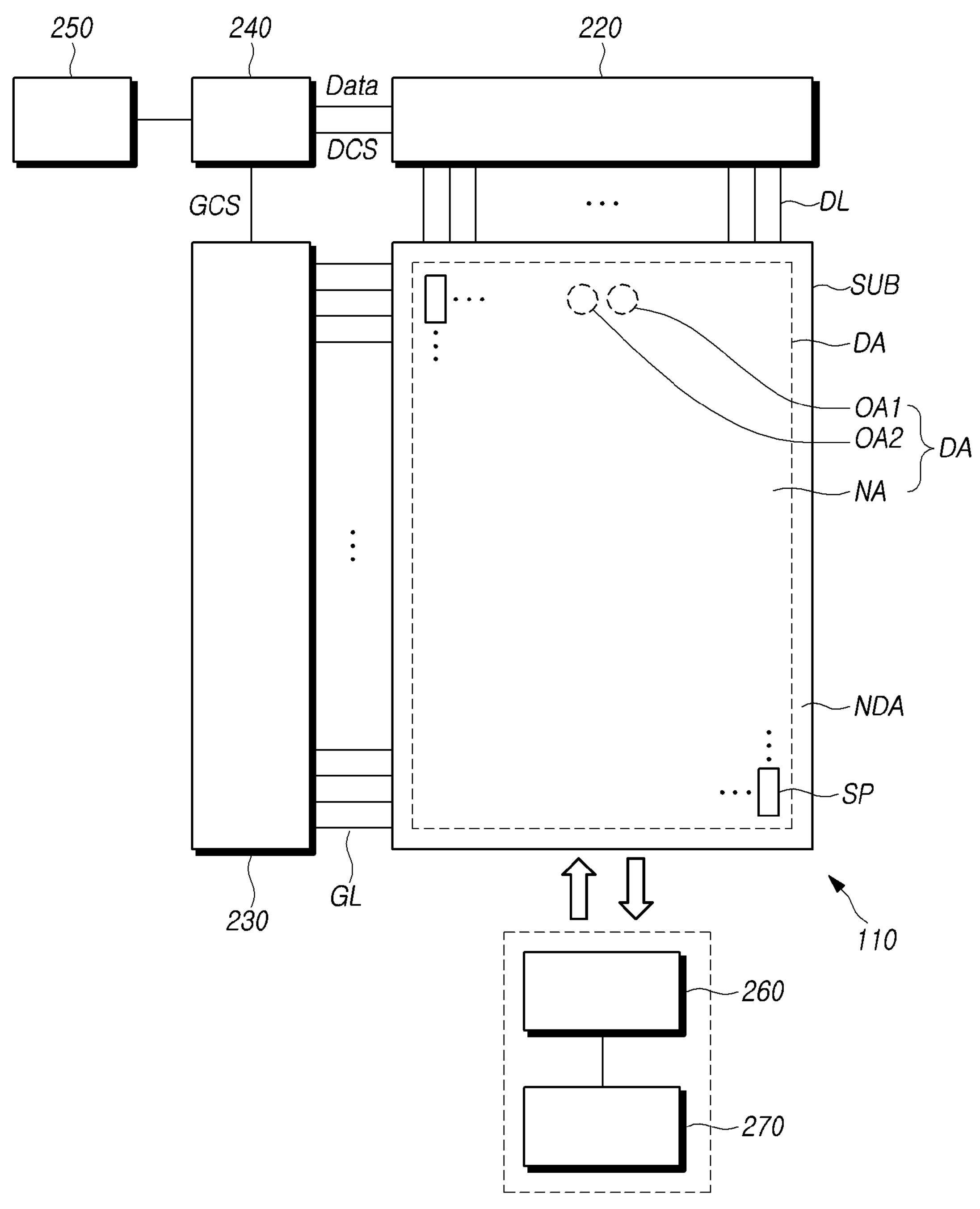
FIG. 2 is a block diagram illustrating a display device according to an aspect of the present disclosure.

Next, FIG. 2 is a block diagram of the display device 100 according to an aspect of the present disclosure. Referring to FIG. 2, the display device 100 includes the display panel 110 and a display driving circuit as components for displaying an image.

The display driving circuit is for driving the display panel 110, and includes a data driving circuit 220, a gate driving circuit 230, a display controller 240, and other components. The display panel 110 includes a display area DA in which an image is displayed and a non-display area NDA in which an image is not displayed. The non-display area NDA is an area outside of the display area DA, and can be referred to as an edge area or a bezel area. All or a portion of the non-display area NDA can be an area visible from the front surface of the display device 100, or an area that is not visible from the front surface of the display device 100 as a corresponding portion is bent.

The display panel 110 also includes a substrate SUB and a plurality of subpixels SP disposed on the substrate SUB. The display panel 110 further includes various types of signal lines to drive the subpixels SP. In addition, the display device 100 can be a liquid crystal display device, or the like, or a self-emission display device in which light is emitted from the display panel 110 itself. When the display device 100 is the self-emission display device, each pixel SP can include a light emitting element.

In one embodiment, the display device 100 can be an organic light emitting display device in which the light emitting element is implemented using an organic light emitting diode (OLED). In another embodiment, the display device 100 can be an inorganic light emitting display device in which the light emitting element is implemented using an inorganic material-based light emitting diode. In still a further another embodiment, the display device 100 can be a quantum dot display device in which the light emitting element is implemented using quantum dots, which are self-emission semiconductor crystals.

In addition, the structure of each pixel SP can vary according to types of the display devices 100. When the display device 100 is a self-emission display device including self-emission subpixels SP, each subpixel SP can include a self-emission light emitting element, one or more transistors, and one or more capacitors. Further, the various types of signal lines arranged in the display device 100 can include, for example, a plurality of data lines DL for carrying data signals (which can be referred to as data voltages or image signals), a plurality of gate lines GL for carrying gate signals (which can be referred to as scan signals), and the like.

The data lines DL and the gate lines GL also intersect each other. Also, each data line DL extends in a first direction and each gate line GL extends in a second direction. Further, the first direction can be a column or vertical direction, and the second direction can be a row or horizontal direction. In another example, the first direction can be the row direction, and the second direction can be the column direction.

In addition, the data driving circuit 220 is for driving the data lines DL, and supplying data signals to the data lines DL. The gate driving circuit 230 is for driving the gate lines GL, and supplies gate signals to the gate lines GL. The display controller 240 is for controlling the data driving circuit 220 and the gate driving circuit 230, and can control a driving timing for the data lines DL and the gate lines GL.

Further, the display controller 240 can supply a data driving control signal DCS to the data driving circuit 220 to control the data driving circuit 220, and supply a gate driving control signal GCS to the gate driving circuit 230 to control the gate driving circuit 230. The display controller 240 can also receive input image data from a host system 250 and supply image data Data to the data driving circuit 220 based on the input image data.

In addition, the data driving circuit 220 can supply data signals to the data lines DL according to a driving timing control of the display controller 240. The data driving circuit 220 can also receive the digital image data Data from the display controller 240, convert the received image data Data into analog data signals, and supply the resulting analog data signals to the data lines DL.

Further, the gate driving circuit 230 can supply gate signals to the gate lines GL according to a timing control of the display controller 240. The gate driving circuit 230 can also receive a first gate voltage corresponding to a turn-on level voltage and a second gate voltage corresponding to a turn-off level voltage along with various gate driving control signals GCS, generate gate signals, and supply the generated gate signals to the gate lines GL.

In addition, the data driving circuit 220 can be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

Also, the gate driving circuit 230 can be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another embodiment, the gate driving circuit 230 can be disposed in the non-display area NDA of the display panel 110 in a gate in panel (GIP) type. The gate driving circuit 230 can also be disposed on or over the substrate, or connected to the substrate. That is, for the GIP type, the gate driving circuit 230 can be disposed in the non-display area NDA of the substrate. The gate driving circuit 230 can also be connected to the substrate in the chip on glass (COG) type, the chip on film (COF) type, or the like.

In addition, at least one of the data driving circuit 220 and the gate driving circuit 230 can be disposed in the display area DA of the display panel 110. For example, at least one of the data driving circuit 220 and the gate driving circuit 230 can be disposed not to overlap subpixels SP, or disposed to be overlapped with one or more, or all, of the subpixels SP.

The data driving circuit 220 can also be located on, but not limited to, only one side or portion (e.g., an upper edge or a lower edge) of the display panel 110. In addition, the data driving circuit 220 can be located in, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 230 can be located in only one side or portion (e.g., a left edge or a right edge) of the display panel 110. In addition, the gate driving circuit 230 can be connected to two sides or portions (e.g., a left edge and a right edge) of the panel 110, or be connected to at least two of four sides or portions (e.g., an upper edge, a lower edge, the left edge, and the right edge) of the panel 110 according to driving schemes, panel design schemes, or the like.

Further, the display controller 240 can be implemented in a separate component from the data driving circuit 220, or integrated with the data driving circuit 220 and thus implemented in an integrated circuit. The display controller 240 can also be a timing controller used in display technology or a controller or a control device for performing other control functions in addition to the function of the timing controller. In addition, the display controller 140 can be a controller or a control device different from the timing controller, or a circuitry or a component included in the controller or the control device. The display controller 240 can also be implemented with various circuits or electronic components such as an integrated circuit (IC), a field programmable gate array (FPGA), an application specific integrated circuit (ASIC), a processor, and/or the like.

In addition, the display controller 240 can be mounted on a printed circuit board, a flexible printed circuit, and/or the like and be electrically connected to the gate driving circuit 230 and the data driving circuit 220 through the printed circuit board, flexible printed circuit, and/or the like. The display controller 240 can also transmit signals to, and receive signals from, the data driving circuit 220 via one or more predefined interfaces. In addition, such interfaces include a low voltage differential signaling (LVDS) interface, an embedded clock point-point interface (EPI), a serial peripheral interface (SPI), and the like.

In addition, to further provide a touch sensing function, as well as an image display function, the display device 100 can include at least one touch sensor, and a touch sensing circuit for detecting whether a touch event occurs by a touch object such as a finger, a pen, or the like, or of detecting a corresponding touch position, by sensing the touch sensor. The touch sensing circuit can include a touch driving circuit 260 for generating and providing touch sensing data by driving and sensing the touch sensor, a touch controller 270 for detecting the occurrence of a touch event or detecting a touch position using the touch sensing data, and one or more other components.

The touch sensor can also include a plurality of touch electrodes and a plurality of touch lines for electrically connecting the touch electrodes to the touch driving circuit 260. The touch sensor can be implemented in a touch panel, or in the form of a touch panel, outside of the display panel 110, or be implemented inside of the display panel 110. When the touch sensor is implemented in the touch panel, or in the form of the touch panel, outside of the display panel 110, such a touch sensor is referred to as an add-on type. When the add-on type of touch sensor is used, the touch panel and the display panel 110 can be separately manufactured and coupled during an assembly process. The add-on type of touch panel can also include a touch panel substrate and a plurality of touch electrodes on the touch panel substrate.

When the touch sensor is implemented inside of the display panel 110, a process of manufacturing the display panel 110 can include disposing the touch sensor over the substrate SUB together with signal lines and electrodes related to driving the display device 100. The touch driving circuit 260 can supply a touch driving signal to at least one of the touch electrodes, and sense at least one of the touch electrodes to generate touch sensing data.

Further, the touch sensing circuit can perform touch sensing using a self-capacitance sensing technique or a mutual-capacitance sensing technique. When the touch sensing circuit performs touch sensing in the self-capacitance sensing technique, the touch sensing circuit can perform touch sensing based on capacitance between each touch electrode and a touch object (e.g., a finger, a pen, and the like).

According to the self-capacitance sensing technique, each of the touch electrodes can serve as both a driving touch electrode and a sensing touch electrode. The touch driving circuit 260 can also drive all, or one or more, of the touch electrodes and sense all, or one or more, of the touch electrodes. When the touch sensing circuit performs touch sensing in the mutual-capacitance sensing technique, the touch sensing circuit can perform touch sensing based on capacitance between touch electrodes.

According to the mutual-capacitance sensing technique, the touch electrodes are divided into driving touch electrodes and sensing touch electrodes. The touch driving circuit 260 can drive the driving touch electrodes and sense the sensing touch electrodes. The touch driving circuit 260 and the touch controller 270 included in the touch sensing circuit can also be implemented in separate devices or in a single device. Further, the touch driving circuit 260 and the data driving circuit 220 can be implemented in separate devices or in a single device.

The display device 100 further includes a power supply circuit for supplying various types of power to the display driving circuit and/or the touch sensing circuit. In addition, the display device 100 can be a mobile terminal such as a smart phone, a tablet, or the like, or a monitor, a television (TV), or the like. Such devices can be of various types, sizes, and shapes. The display device 100 according to embodiments of the present disclosure are not limited thereto, and includes displays of various types, sizes, and shapes for displaying information or images.

As described above, the display area DA of the display panel 110 can include a normal area NA and optical areas OA1 and/or OA2, for example, as shown in FIGS. 1A-1D. The normal area NA and the optical areas OA1 and/or OA2 are areas where an image can be displayed. However, the light transmission structure can be omitted in the normal NA, and provided only in the optical areas OA1 and/or OA2.

In addition, the following description assumes the display area DA includes first and second optical areas OA1 and OA2 and the normal area NA, as in FIGS. 1C and 1D; and the normal area NA thereof includes the normal areas NAs in FIGS. 1A-1D, and the first and second optical areas OA1 and/or OA2 thereof include the first optical areas OA1*s* in FIGS. 1A-1D and the second optical areas OA2*s* of FIGS. 1C and 1D, respectively, unless explicitly stated otherwise.

Figure 3:
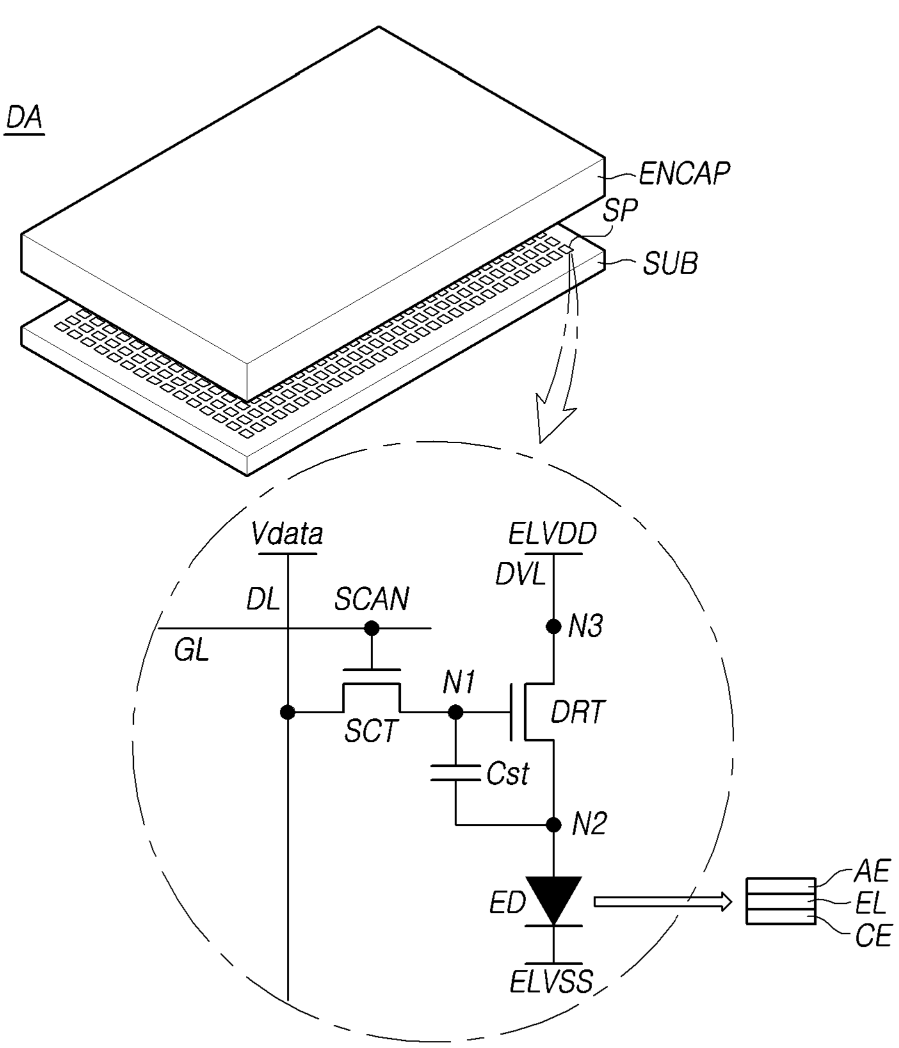
FIG. 3 is an overview illustrating an equivalent circuit of a subpixel in a display panel according to an aspect of the present disclosure.

Next, FIG. 3 is an overview illustrating an equivalent circuit of a subpixel SP in the display panel 110 according to an aspect of the present disclosure. Each subpixel SP disposed in the normal area NA, the first optical area OA1, and the second optical area OA2 included in the display area DA of the display panel 110 can include a light emitting element ED, a driving transistor DRT for driving the light emitting element ED, a scan transistor SCT for transmitting a data voltage Vdata to a first node N1 of the driving transistor DRT, a storage capacitor Cst for maintaining a voltage at an approximate constant level during one frame, and the like.

The driving transistor DRT includes the first node N1 to which a data voltage is applied, a second node N2 electrically connected to the light emitting element ED, and a third node N3 to which a driving voltage ELVDD through a driving voltage line DVL is applied. In the driving transistor DRT, the first node N1 can be a gate node, the second node N2 can be a source node or a drain node, and the third node N3 can be the drain node or the source node.

Further, the light emitting element ED includes an anode electrode AE, an emission layer EL, and a cathode electrode CE. The anode electrode AE can be a pixel electrode disposed in each subpixel SP, and can be electrically connected to the second node N2 of the driving transistor DRT of each subpixel SP. Also, the cathode electrode CE can be a common electrode commonly disposed in the subpixels SP, and a base voltage ELVSS such as a low-level voltage can be applied to the cathode electrode CE.

In one example, the anode electrode AE can be the pixel electrode, and the cathode electrode CE can be the common electrode. In another example, the anode electrode AE can be the common electrode, and the cathode electrode CE can be the pixel electrode. The following description assumes the anode electrode AE is the pixel electrode, and the cathode electrode CE is the common electrode unless explicitly stated otherwise.

In addition, the light emitting element ED can be, for example, an organic light emitting diode (OLED), an inorganic light emitting diode, a quantum dot light emitting element, or the like. When an organic light emitting diode is used as the light emitting element ED, the emission layer EL included in the light emitting element ED can include an organic emission layer including an organic material.

In addition, the scan transistor SCT can be turned on and off by a scan signal SCAN that is a gate signal applied through a gate line GL, and be electrically connected between the first node N1 of the driving transistor DRT and a data line DL. The storage capacitor Cst can also be electrically connected between the first node N1 and the second node N2 of the driving transistor DRT.

Further, each subpixel SP can include two transistors (2T: DRT and SCT) and one capacitor (1C: Cst) (which can be referred to as a "2T1C structure") as shown in FIG. 3, and in some instances, can further include one or more transistors, or capacitors. In addition, the storage capacitor Cst, which is provided between the first node N1 and the second node N2 of the driving transistor DRT, can be an external capacitor intentionally configured or designed to be located outside of the driving transistor DRT, other than internal capacitors, such as parasitic capacitors (e.g., a gate-to-source capacitance Cgs, a gate-to-drain capacitance Cgd, and the like).

Each of the driving transistor DRT and the scan transistor SCT can be an n-type transistor or a p-type transistor. Because circuit elements (e.g., in particular, a light emitting element ED) in each subpixel SP are vulnerable to external moisture or oxygen, an encapsulation layer ENCAP can be disposed in the display panel 110 to prevent the external moisture or oxygen from penetrating into the circuit elements (e.g., in particular, the light emitting element ED).

The encapsulation layer ENCAP can be disposed to cover the light emitting element ED.

Figure 4A:
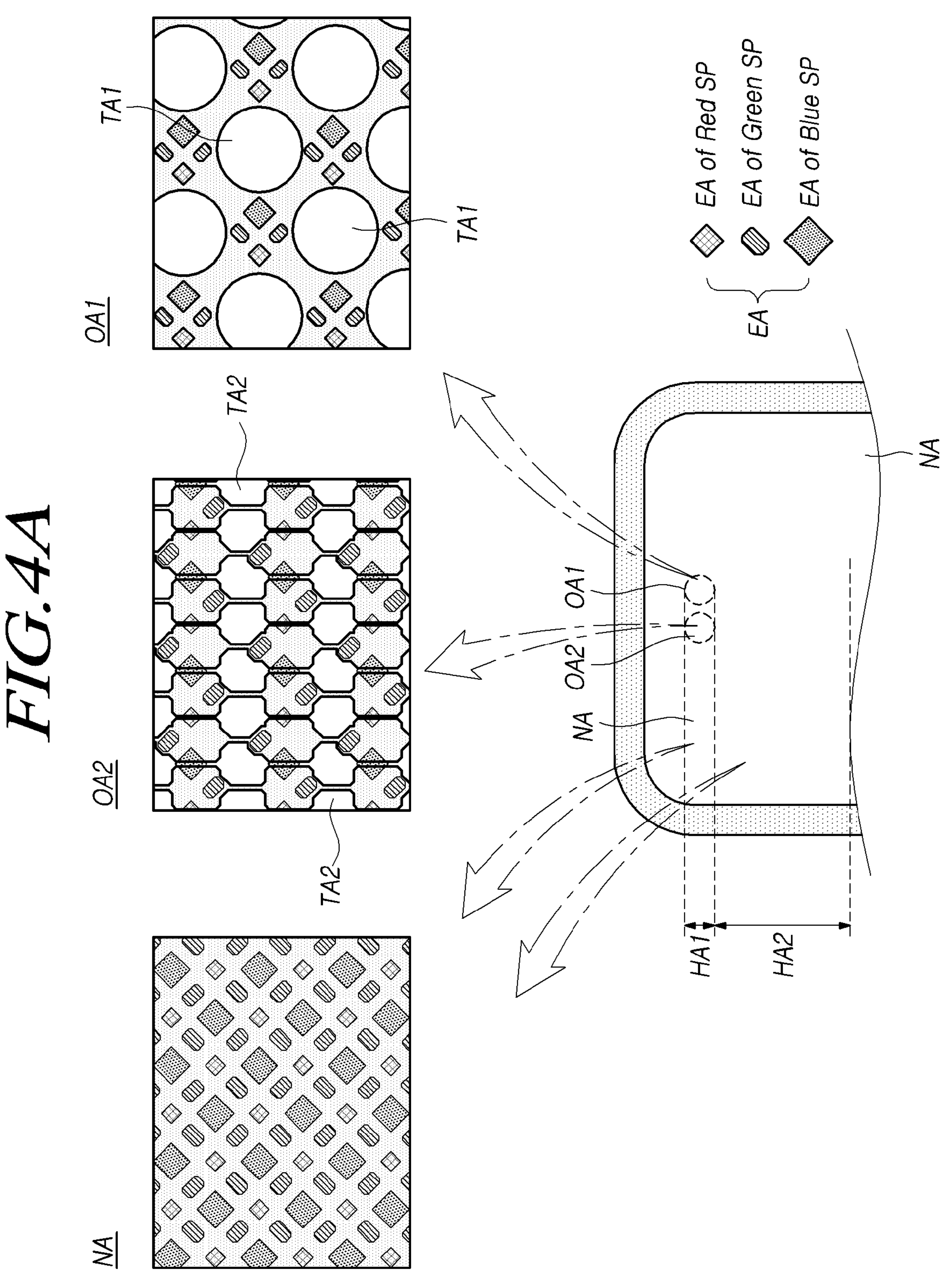
FIG. 4A is an overview illustrating arrangements of subpixels in three areas included in a display area of the display panel according to an aspect of the present disclosure.
Figure 4B:
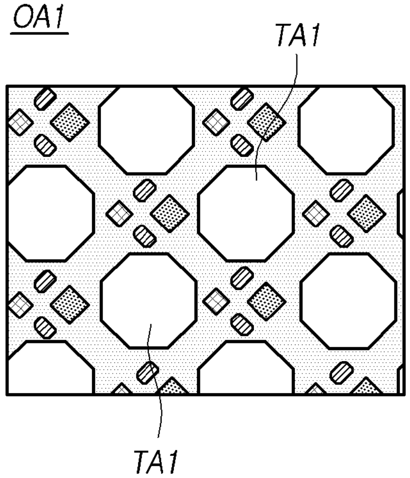
FIG. 4B is an overview illustrating a structure of a first optical area of the display panel according to an aspect of the present disclosure.

Next, FIG. 4A is an overview illustrating arrangements of subpixels SP in the three areas (NA, OA1, and OA2) included in the display area DA of the display panel 110 according to an aspect of the present disclosure. Further, FIG. 4B is an overview illustrating a structure of the first optical area OA1 of the display panel 110 according to an aspect of the present disclosure.

Referring to FIG. 4A, a plurality of subpixels SP are disposed in each of the normal area NA, the first optical area OA1, and the second optical area OA2 included in the display area DA. The subpixels SP can include, for example, a red subpixel (Red SP) emitting red light, a green subpixel (Green SP) emitting green light, and a blue subpixel (Blue SP) emitting blue light.

Accordingly, the normal area NA, the first optical area OA1, and the second optical area OA2 can include light emitting areas EA of red subpixels (Red SP), and emitting areas EA of green subpixels (Green SP), and light emitting areas EA of blue subpixels (Blue SP).

Referring to FIG. 4A, the normal area NA does not include a light transmission structure, but does include the light emitting areas EA. In contrast, the first and second optical areas OA1 and OA2 include both the light emitting areas EA and the light transmission structure. Accordingly, the first optical area OA1 can includes light emitting areas EA and first transmission areas TA1, and the second optical area OA2 includes light emitting areas EA and second transmission areas TA2.

In addition, the light emitting areas EA and the transmission areas (TA1 and/or TA2) can be distinct according to whether the transmission of light is allowed. For example, the light emitting areas EA can be areas not allowing light to transmit (e.g., not allowing light to transmit to the back of the display panel), and the transmission areas (TA1 and/or TA2) can be areas allowing light to transmit (e.g., allowing light to transmit to the back of the display panel).

The light emitting areas EA and the transmission areas TA1 and/or TA2 can be also distinct according to whether or not a specific metal layer is included. For example, the cathode electrode CE as shown in FIG. 3 can be disposed in the light emitting areas EA, and the cathode electrode CE may not be disposed in the transmission areas TA1 and/or TA2. In addition, a light shield layer can be disposed in the light emitting areas EA, and a light shield layer may not be disposed in the transmission areas TA1 and/or TA2.

Because the first optical area OA1 includes the first transmission areas TA1 and the second optical area OA2 includes the second transmission areas TA2, both of the first and second optical areas OA1 and OA2 are areas through which light can transmit. In one embodiment, a transmittance (a degree of transmission) of the first optical area OA1 and a transmittance (a degree of transmission) of the second optical area OA2 can be substantially equal. For example, the first transmission area TA1 of the first optical area OA1 and the second transmission area TA2 of the second optical area OA2 can have substantially the same shape or size.

In another example, even when the first transmission area TA1 of the first optical area OA1 and the second transmission area TA2 of the second optical area OA2 have different shapes or sizes, a ratio of the first transmission area TA1 to the first optical area OA1 and a ratio of the second transmission area TA2 to the second optical area OA2 can be substantially equal. In addition, in one example, each of the first transmission areas TA1*s* has the same shape and size, and each of the second transmission areas TA2*s* has the same shape and size.

In another embodiment, a transmittance (a degree of transmission) of the first optical area OA1 and a transmittance (a degree of transmission) of the second optical area OA2 can be different from each other. For example, the first transmission area TA1 of the first optical area OA1 and the second transmission area TA2 of the second optical area OA2 can have different shapes or sizes. In another example, even when the first transmission area TA1 of the first optical area OA1 and the second transmission area TA2 of the second optical area OA2 have substantially the same shape or size, a ratio of the first transmission area TA1 to the first optical area OA1 and a ratio of the second transmission area TA2 to the second optical area OA2 can be different from each other.

For example, when the first optical electronic device 11, as shown in FIGS. 1A-1C, overlapping the first optical area OA1 is a camera, and the second optical electronic device 12, as shown in FIGS. 1C and 1D, overlapping the second optical area OA2 is a sensor for detecting images, the camera may need a greater amount of light than the sensor.

Thus, the transmittance (degree of transmission) of the first optical area OA1 can be greater than the transmittance (degree of transmission) of the second optical area OA2. For example, the first transmission area TA1 of the first optical area OA1 can have a size greater than the second transmission area TA2 of the second optical area OA2. In another example, even when the first transmission area TA1 of the first optical area OA1 and the second transmission area TA2 of the second optical area OA2 have substantially the same size, a ratio of the first transmission area TA1 to the first optical area OA1 can be greater than a ratio of the second transmission area TA2 to the second optical area OA2. As shown in FIG. 4A, the first transmission area TA1 of the first optical area OA1 can have a circular shape in a cross-sectional view, but the structure of the first transmission area TA1 according to embodiments of the present disclosure is not limited thereto.

In another embodiment, as shown in FIG. 4B, the first transmission area TA1 of the first optical area OA1 can have an octagonal shape. In addition, the first transmission area TA1 of the first optical area OA1 can have an elliptical or polygonal shape. Thus, the transmittance of the first transmission area TA1 can be adjusted and an area or size of the light emitting area of the first optical area OA1 can be adjusted, by changing a shape of the first transmission area TA1.

The following description is provided based on the embodiment in which the transmittance (degree of transmission) of the first optical area OA1 is greater than the transmittance (degree of transmission) of the second optical area OA2. Further, the transmission areas TA1 and/or TA2 as shown in FIG. 4A can be referred to as transparent areas, and the term transmittance can be referred to as transparency.

Further, the following description assumes the first optical and second optical areas OA1 and OA2 are located in an upper edge of the display area DA of the display panel 110, and are disposed to be horizontally adjacent to each other in a direction in which the upper edge extends, as shown in FIG. 4A, unless explicitly stated otherwise.

Referring to FIG. 4A, a horizontal display area in which the first and second optical areas OA1 and OA2 are disposed is referred to as a first horizontal display area HAL and another horizontal display area in which the first and second optical areas OA1 and OA2 are not disposed is referred to as a second horizontal display area HA2. Referring to FIG. 4A, the first horizontal display area HA1 can include a portion of the normal area NA, the first optical area OA1, and the second optical area OA2. The second horizontal display area HA2 can include only another portion of the normal area NA.

Figure 5A:
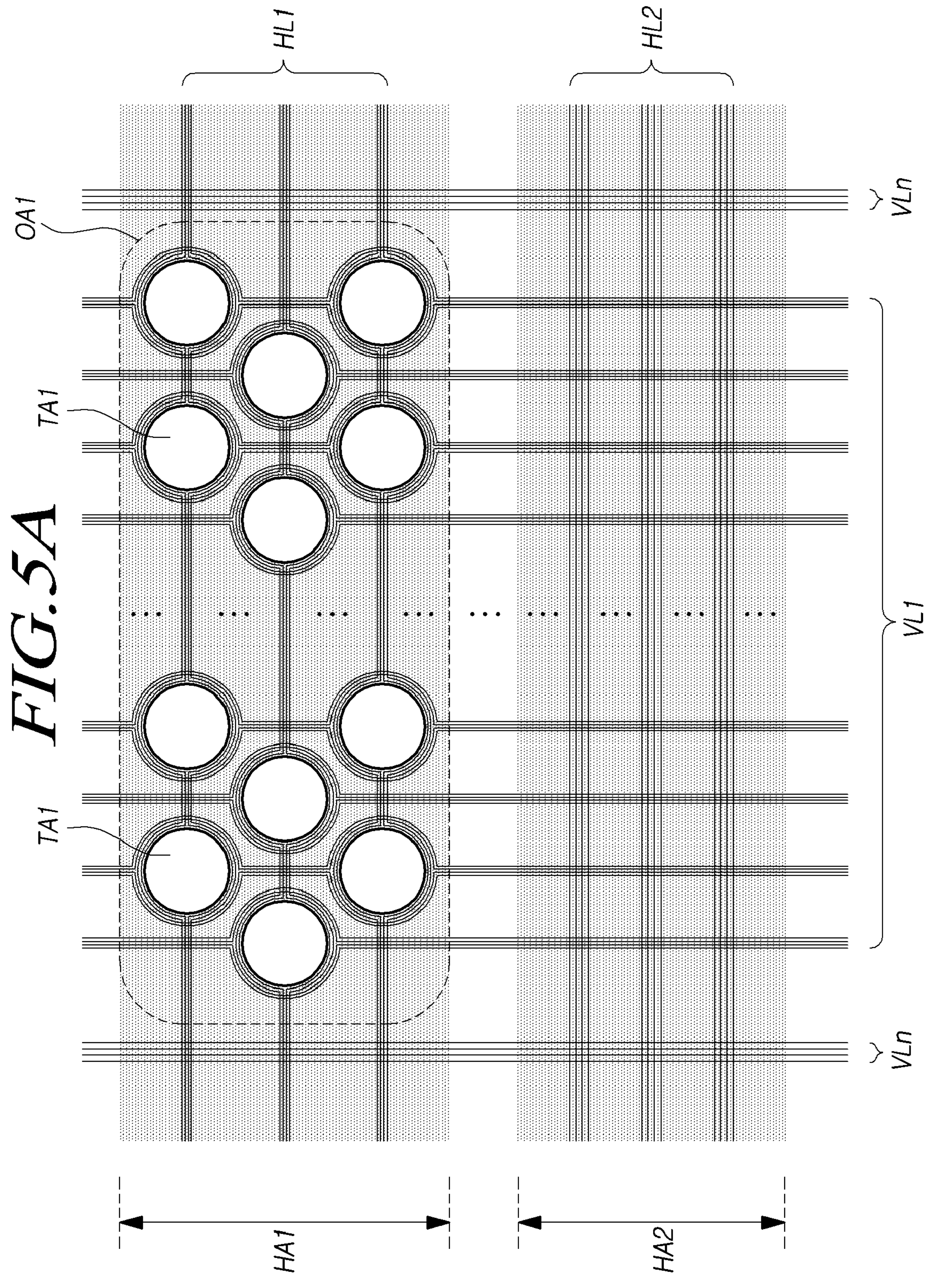
FIG. 5A is an overview illustrating arrangements of signal lines in the first optical area and a normal area in the display panel according to an aspect of the present disclosure.
Figure 5B:
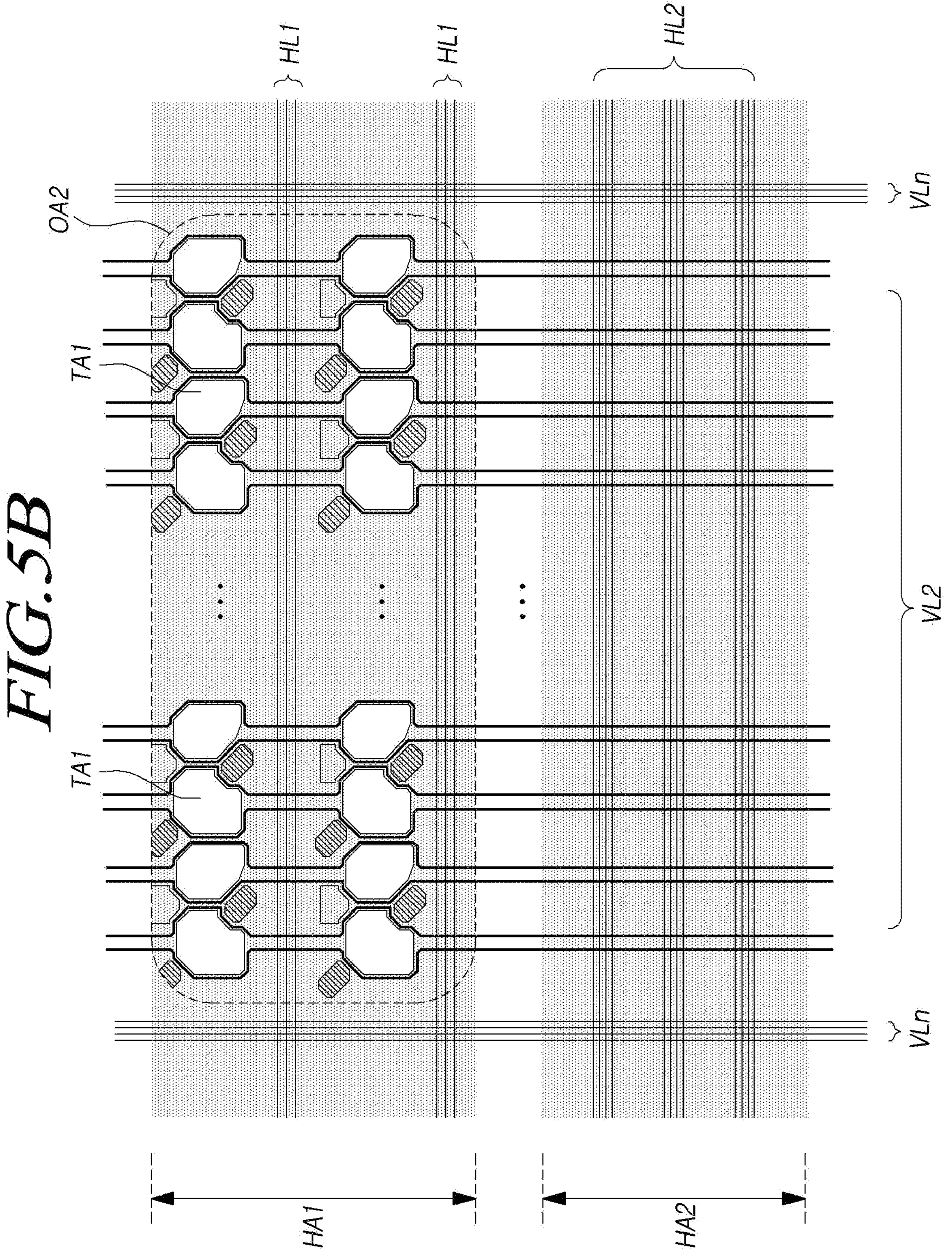
FIG. 5B is an overview illustrating arrangements of signal lines in a second optical area and the normal area in the display panel according to an aspect of the present disclosure.

Next, FIG. 5A is an overview illustrating arrangements of signal lines in each of the first optical area OA1 and the normal area NA of the display panel 110, and FIG. 5B is an overview illustrating arrangements of signal lines in each of the second optical area OA2 and the normal area NA of the display panel 110 according to an aspect of the present disclosure.

In addition, the horizontal display areas HA1 shown in FIGS. 5A and 5B are portions of the first horizontal display area HA1 of the display panel 110, and the horizontal display area HA2 shown in FIGS. 5A and 5B are portions of the second horizontal display area HA2 of the display panel 110. Also, the first optical area OA1 shown in FIG. 5A is a portion of the first optical area OA1 of the display panel 110, and the second optical area OA2 shown in FIG. 5B is a portion of the second optical area OA2 of the display panel 110.

Referring to FIGS. 5A and 5B, the first horizontal display area HA1 can include a portion of the normal area NA, the first optical area OA1, and the second optical area OA2. The second horizontal display area HA2 includes another portion of the normal area NA. In addition, various types of horizontal lines (HL1 and HL2) and various types of vertical lines (VLn, VL1, and VL2) can be disposed in the display panel 110.

In addition, the terms "horizontal" and "vertical" are used to refer to two directions intersecting the display panel; however, the horizontal and vertical directions can be changed depending on a viewing direction. The horizontal direction refers to, for example, a direction in which one gate line GL extends and, and the vertical direction refers to, for example, a direction in which one data line DL extends. As such, the terms horizontal and vertical are used to represent two directions.

Referring to FIGS. 5A and 5B, the horizontal lines disposed in the display panel 110 can include first horizontal lines HL1 disposed in the first horizontal display area HA1 and second horizontal lines HL2 disposed on the second horizontal display area HA2. The first horizontal lines HL1 and the second horizontal lines HL2 can be the gate lines GL. Also, the gate lines GL can include various types of gate lines according to structures of one or more subpixels SP.

Referring to FIGS. 5A and 5B, the vertical lines disposed in the display panel 110 can include vertical lines VLn disposed only in the normal area NA, first vertical lines VL1 running through both of the first optical area OA1 and the normal area NA, and second vertical lines VL2 running through both of the second optical area OA2 and the normal area NA. The vertical lines disposed in the display panel 110 can include data lines DL, driving voltage lines DVL, and the like, and may further include reference voltage lines, initialization voltage lines, and the like. That is, the vertical lines VLn, the first vertical lines VL1 and the second vertical lines VL2 can include the data lines DL, the driving voltage lines DVL, and the like, and may further include the reference voltage lines, the initialization voltage lines, and the like.

In addition, the term "horizontal" in the second horizontal line HL2 can mean only that a signal is carried from a left side to a right side of the display panel (or from the right side to the left side), and not that the second horizontal line HL2 runs in a straight line only in the direct horizontal direction. For example, in FIGS. 5A and 5B, although the second horizontal lines HL2 are illustrated in a straight line, one or more of the second horizontal lines HL2 can include one or more bent or folded portions that are different from the configurations shown in FIGS. 5A and 5B. Likewise, one or more of the first horizontal lines HL1 can also include one or more bent or folded portions.

In addition, the term "vertical" in the typical vertical line VLn can mean only that a signal is carried from an upper portion to a lower portion of the display panel (or from the lower portion to the upper portion), and not that the typical vertical line VLn runs in a straight line only in the direct vertical direction. For example, in FIGS. 5A and 5B, although the typical vertical lines VLn are illustrated in a straight line, one or more of the typical vertical lines VLn can include one or more bent or folded portions that are different from the configurations shown in FIGS. 5A and 5B. Likewise, one or more of the first and second vertical lines VL1 and VL2 can also include one or more bent or folded portions.

Referring to FIG. 5A, the first optical area OA1 included in the first horizontal display area HA1 can include light emitting areas EA, as shown in FIG. 4, and first transmission areas TA1. In the first optical area OA1, respective outer areas of the first transmission areas TA1 can include corresponding light emitting areas EA.

As shown, to improve the transmittance of the first optical area OA1, the first horizontal lines HL1 runs through the first optical area OA1 while avoiding the first transmission areas TA1. Accordingly, each of the first horizontal lines HL1 running through the first optical area OA1 can include one or more curved or bent portions running around one or more respective outer edges of one or more of the first transmission areas TA1.

Also, the first horizontal lines HL1 disposed in the first horizontal display area HA1 and the second horizontal lines HL2 disposed in the second horizontal display area HA2 can have different shapes or lengths. For example, the first horizontal lines HL1 running through the first optical area OA1 and the second horizontal lines HL2 not running through the first optical area OA1 can have different shapes or lengths.

Further, to improve the transmittance of the first optical area OA1, the first vertical lines VL1 can run through the first optical area OA1 while avoiding the first transmission areas TA1. Accordingly, each of the first vertical lines VL1 running through the first optical area OA1 can include one or more curved or bent portions running around one or more respective outer edges of one or more of the first transmission areas TA1. Thus, the first vertical lines VL1 running through the first optical area OA1 and the typical vertical lines VLn disposed in the normal area NA without running through the first optical area OA1 can have different shapes or lengths.

Referring to FIG. 5A, the first transmission areas TA1 included in the first optical area OA1 in the first horizontal display area HA1 can be arranged in a diagonal direction. In addition, in the first optical area OA1 in the first horizontal display area HAL one or more light emitting areas EA can be disposed between two horizontally adjacent first transmission areas TA1. Also, in the first optical area OA1 in the first horizontal display area HAL one or more light emitting areas EA can be disposed between two vertically adjacent first transmission areas TA1.

Referring to FIG. 5A, each of the first horizontal lines HL1 disposed in the first horizontal display area HA1 (e.g., each of the first horizontal lines HL1 running through the first optical area OA1) can include one or more curved or bent portions running around one or more respective outer edges of one or more of the first transmission areas TA1. Referring to FIG. 5B, the second optical area OA2 included in the first horizontal display area HA1 can include light emitting areas EA and second transmission areas TA2. In the second optical area OA2, respective outer areas of the second transmission areas TA2 can include corresponding light emitting areas EA.

In addition, the light emitting areas EA and the second transmission areas TA2 in the second optical area OA2 can have substantially the same locations and arrangements as the light emitting areas EA and the first transmission areas TA1 in the first optical area OA1 of FIG. 5A. In another embodiment, as shown in FIG. 5B, the light emitting areas EA and the second transmission areas TA2 in the second optical area OA2 can have locations and arrangements different from the light emitting areas EA and the first transmission areas TA1 in the first optical area OA1 of FIG. 5A.

For example, referring to FIG. 5B, the second transmission areas TA2 in the second optical area OA2 can be arranged in the horizontal direction (the left to right or right to left direction). In this example, a light emitting area EA is disposed between two second transmission areas TA2 adjacent to each other in the horizontal direction. Further, one or more of the light emitting areas EA in the second optical area OA2 can be disposed between second transmission areas TA2 adjacent to each other in the vertical direction (the top to bottom or bottom to top direction). For example, one or more light emitting areas EA can be disposed between two rows of second transmission areas.

When in the first horizontal display area HAL running through the second optical area OA2 and the normal area NA adjacent to the second optical area OA2, in one embodiment, the first horizontal lines HL1 can have substantially the same arrangement as the first horizontal lines HL1 of FIG. 5A. In another embodiment, as shown in FIG. 5B, when in the first horizontal display area HAL running through the second optical area OA2 and the normal area NA adjacent to the second optical area OA2, the first horizontal lines HL1 can have an arrangement different from the first horizontal lines HL1 of FIG. 5A. This is because the light emitting areas EA and the second transmission areas TA2 in the second optical area OA2 of FIG. 5B have locations and arrangements different from the light emitting areas EA and the first transmission areas TA1 in the first optical area OA1 of FIG. 5A.

Referring to FIG. 5B, when in the first horizontal display area HAL the first horizontal lines HL1 run through the second optical area OA2 and the normal area NA adjacent to the second optical area OA2, the first horizontal lines HL1 can run between vertically adjacent second transmission areas TA2 in a straight line without having a curved or bent portion. For example, one first horizontal line HL1 can have one or more curved or bent portions in the first optical area OA1, and not have a curved or bent portion in the second optical area OA2.

To improve the transmittance of the second optical area OA2, the second vertical lines VL2 can run through the second optical area OA2 while avoiding the second transmission areas TA2 in the second optical area OA2. Accordingly, each of the second vertical lines VL2 running through the second optical area OA2 can include one or more curved or bent portions running around one or more respective outer edges of one or more of the second transmission areas TA2. Thus, the second vertical lines VL2 running through the second optical area OA2 and the vertical lines VLn disposed in the normal area NA without running through the second optical area OA2 can have different shapes or lengths.

As shown in FIG. 5A, each, or one or more, of the first horizontal lines HL1 running through the first optical area OA1 can have one or more curved or bent portions running around one or more respective outer edges of one or more of the first transmission areas TA1. Accordingly, a length of the first horizontal line HL1 running through the first and second optical areas OA1 and OA2 can be slightly longer than a length of the second horizontal line HL2 disposed only in the normal area NA without running through the first and second optical areas OA1 and OA2.

Accordingly, a resistance of the first horizontal line HL1 running through the first and second optical areas OA1 and OA2, which is referred to as a first resistance, can be slightly greater than a resistance of the second horizontal line HL2 disposed only in the normal area NA without running through the first and second optical areas OA1 and OA2, which is referred to as a second resistance.

Referring to FIGS. 5A and 5B, because the first optical area OA1 at least partially overlapping the first optical electronic device 11 includes the first transmitting areas TA1, and the second optical area OA2 at least partially overlapping with the second optical electronic device 12 includes the second transmission areas TA2, the first and second optical areas OA1 and OA2 can have a number of subpixels per unit area smaller than the normal area NA.

Accordingly, the number of subpixels connected to each, or one or more, of the first horizontal lines HL1 running through the first and second optical areas OA1 and OA2 can be different from the number of subpixels connected to each, or one or more, of the second horizontal lines HL2 disposed only in the normal area NA without running through the first and second optical areas OA1 and OA2. The number of subpixels connected to each, or one or more, of the first horizontal lines HL1 running through the first and second optical areas OA1 and OA2, which is referred to as a first number, can also be less than the number of subpixels connected to each, or one or more, of the second horizontal lines HL2 disposed only in the normal area NA without running through the first and second optical areas OA1 and OA2, which is referred to as a second number.

A difference between the first number and the second number can also vary according to a difference between a resolution of each of the first and second optical areas OA1 and OA2 and a resolution of the normal area NA. For example, as a difference between a resolution of each of the first and second optical areas OA1 and OA2 and a resolution of the normal area NA increases, a difference between the first number and the second number can increase.

As described above, because the number (the first number) of subpixels connected to each, or one or more, of the first horizontal lines HL1 running through the first and second optical areas OA1 and OA2 is less than the number of subpixels (second number) connected to each, or one or more, of the second horizontal lines HL2 disposed only in the normal area NA without running through the first and second optical areas OA1 and OA2, an area where the first horizontal line HL1 overlaps one or more other electrodes or lines adjacent to the first horizontal line HL1 can be smaller than an area where the second horizontal line HL2 overlaps one or more other electrodes or lines adjacent to the second horizontal line HL2.

Accordingly, a parasitic capacitance formed between the first horizontal line HL1 and one or more other electrodes or lines adjacent to the first horizontal line HL1, which is referred to as a first capacitance, can be much smaller than a parasitic capacitance formed between the second horizontal line HL2 and one or more other electrodes or lines adjacent to the second horizontal line HL2, which is referred to as a second capacitance.

Considering a relationship in magnitude between the first and second resistance (the first resistance≥the second resistance) and a relationship in magnitude between the first and second capacitance (the first capacitance<<second capacitance), a resistance-capacitance (RC) value of the first horizontal line HL1 running through the first and second optical areas OA1 and OA2, which is referred to as a first RC value, can be much less than an RC value of the second horizontal lines HL2 disposed only in the normal area NA without running through the first and second optical areas OA1 and OA2, which is referred to as a second RC value. Thus, in this example, the first RC value is much smaller than the second RC value (i.e., the first RC value<<the second RC value).

Due to such a difference between the first RC value of the first horizontal line HL1 and the second RC value of the second horizontal line HL2, which is referred to as an RC load difference, a signal transmission characteristic through the first horizontal line HL1 can be different from a signal transmission characteristic through the second horizontal line HL2.

Figure 6:
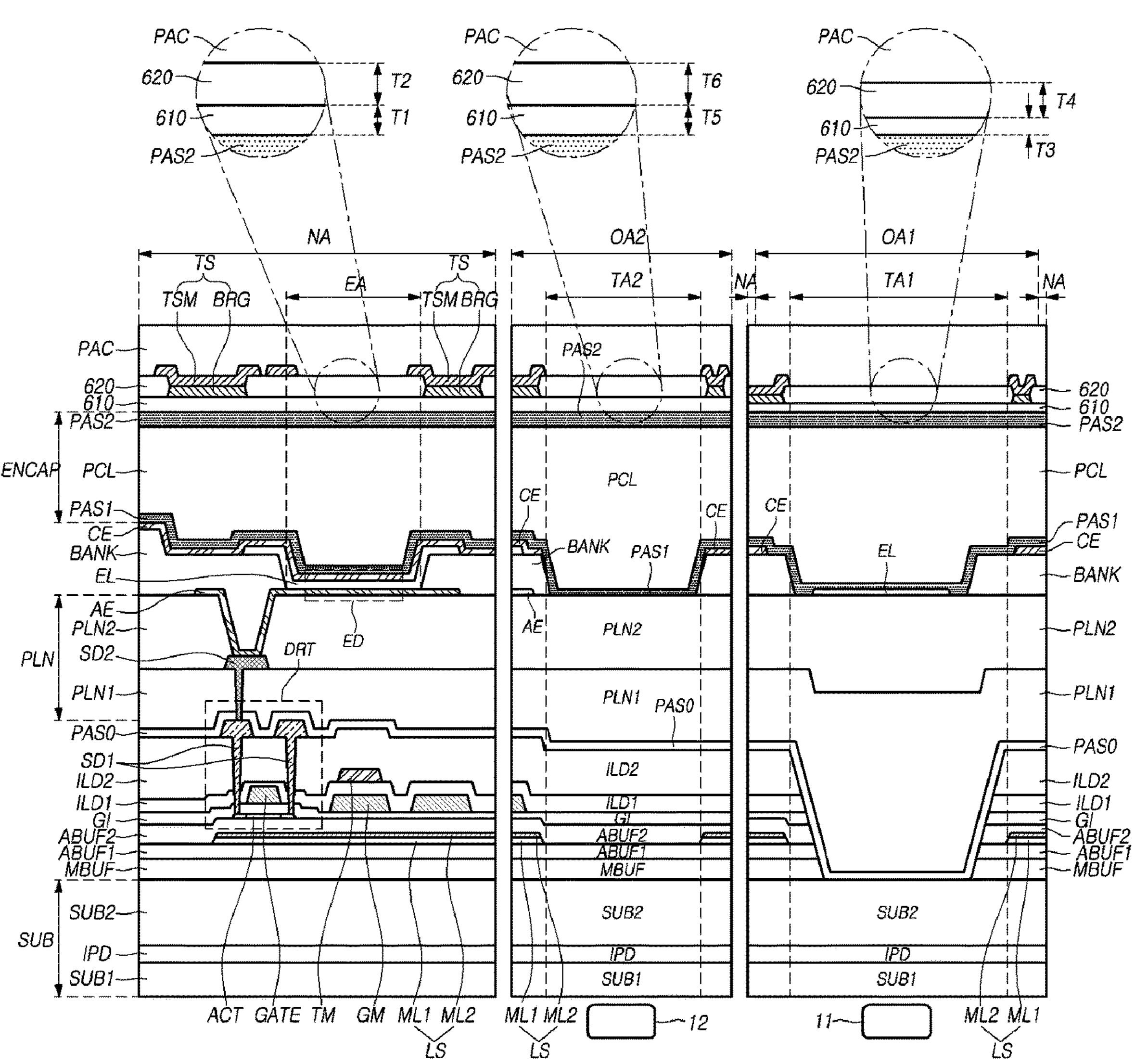
FIGS. 6 and 7 are cross-sectional views of the first and second optical areas, and the normal area included in the display area according to an aspect of the present disclosure.
Figure 7:
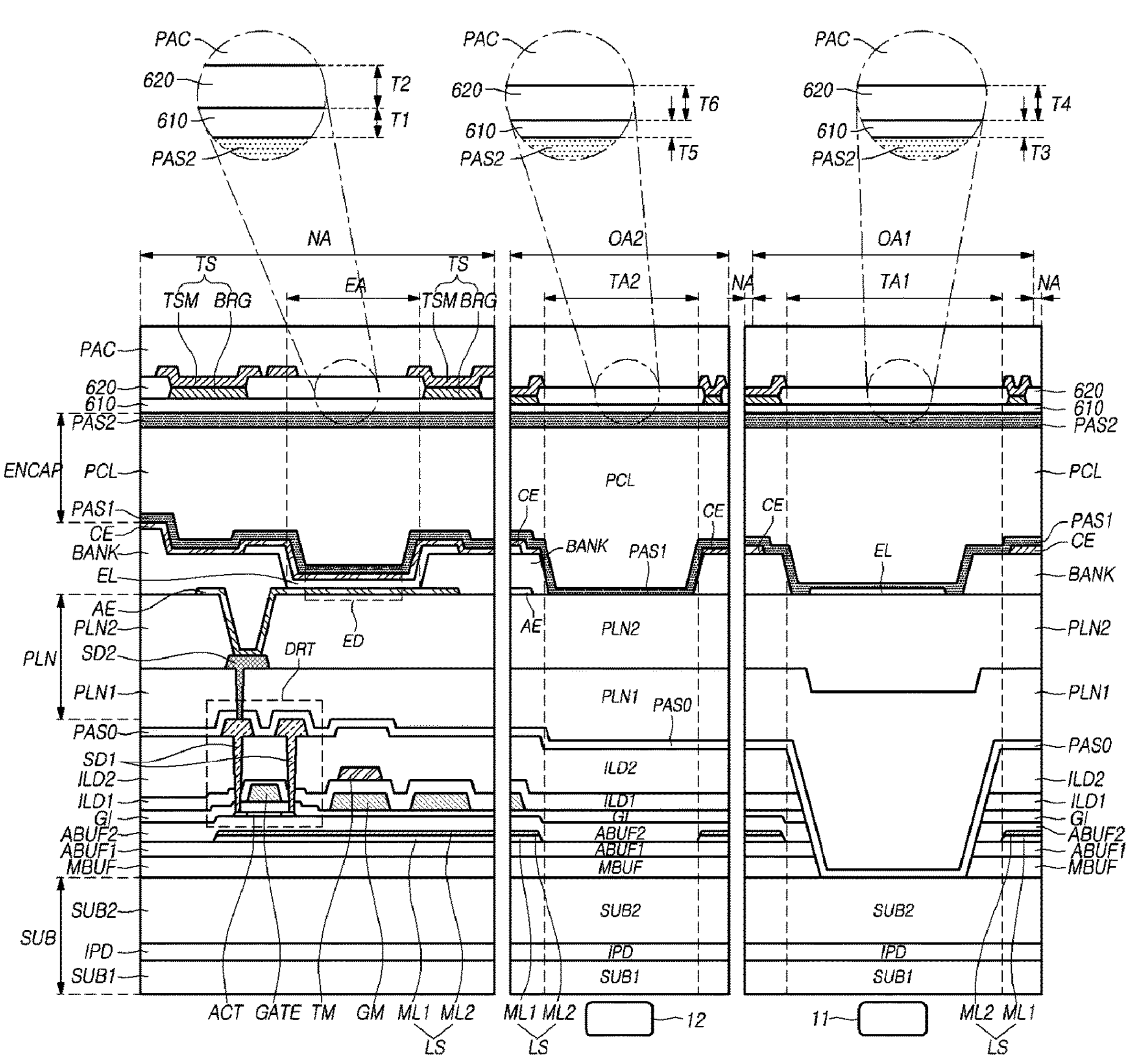

Next, FIGS. 6 and 7 are cross-sectional views of each of the first optical area OA1, the second optical area OA2, and the normal area NA included in the display area DA of the display panel 110 according to an aspect of the present disclosure. In particular, FIGS. 6 and 7 are cross-sectional views of the normal area NA, the first optical area OA1, and the second optical area OA2 included in the display area DA.

First, a stack structure of the normal area NA will be described with reference to FIGS. 6 and 7. Respective light emitting areas EA of the first and second optical areas OA1 and OA2 have the same stack structure as a light emitting area EA of the normal area NA.

As shown in FIGS. 6 and 7, a substrate SUB includes a first substrate SUB1, an interlayer insulating layer IPD, and a second substrate SUB2. The interlayer insulating layer IPD is interposed between the first substrate SUB1 and the second substrate SUB2. As the substrate SUB includes the first substrate SUB1, the interlayer insulating layer IPD, and the second substrate SUB2, the substrate SUB can prevent or reduce the penetration of moisture. The first and second substrates SUB1 and SUB2 can be, for example, polyimide (PI) substrates and be referred to as a primary and second PI substrates, respectively.

In addition, various types of patterns ACT, SD1, GATE, for disposing one or more transistors such as a driving transistor DRT, and the like, various types of insulating layers MBUF, ABUF1, ABUF2, GI, ILD1, ILD2, PAS0, and various types of metal patterns TM, GM, ML1, ML2 can be disposed on or over the substrate SUB. A multi-buffer layer MBUF can also be disposed on the second substrate SUB2, and a first active buffer layer ABUF1 can be disposed on the multi-buffer layer MBUF.

In addition, a first metal layer ML1 and a second metal layer ML2 can be disposed on the first active buffer layer ABUF1. In particular, the first metal layer ML1 and the second metal layer ML2 can be, for example, light shield layers LS for shielding light. Also, a second active buffer layer ABUF2 can be disposed on the first metal layer ML1 and the second metal layer ML2. An active layer ACT of the driving transistor DRT can also be disposed on the second active buffer layer ABUF2. A gate insulating layer GI is also disposed to cover the active layer ACT.

Further, a gate electrode GATE of the driving transistor DRT can be disposed on the gate insulating layer GI. Also, a gate material layer GM can be disposed on the gate insulating layer GI, together with the gate electrode GATE of the driving transistor DRT, at a location different from the location where the driving transistor DRT is disposed.

A first interlayer insulating layer ILD1 can also be disposed to cover the gate electrode GATE and the gate material layer GM. A metal pattern TM can be disposed on the first interlayer insulating layer ILD1 and be located at a location different from the location where the driving transistor DRT is formed. A second interlayer insulating layer ILD2 can also be disposed to cover the metal pattern TM on the first interlayer insulating layer ILD1.

In addition, two first source-drain electrode patterns SD1 are disposed on the second interlayer insulating layer ILD2. One of the two first source-drain electrode patterns SD1 can be a source node of the driving transistor DRT, and the other can be a drain node of the driving transistor DRT. The two first source-drain electrode patterns SD1 are also electrically connected to first and second side portions of the active layer ACT, respectively, through contact holes formed in the second interlayer insulating layer ILD2, the first interlayer insulating layer ILD1, and the gate insulating layer GI.

A portion of the active layer ACT overlapping the gate electrode GATE also serves as a channel region. One of the two first source-drain electrode patterns SD1 can be connected to the first side portion of the channel region of the active layer ACT, and the other of the two first source-drain electrode patterns SD1 can be connected to the second side portion of the channel region of the active layer ACT.

A passivation layer PAS0 is also disposed to cover the two first source-drain electrode patterns SD1, and planarization layer PLN is disposed on the passivation layer PAS0. As shown, the planarization layer PLN can include a first planarization layer PLN1 and a second planarization layer PLN2. In addition, as shown, the first planarization layer PLN1 can be disposed on the passivation layer PAS0.

A second source-drain electrode pattern SD2 is also disposed on the first planarization layer PLN1 and can be connected to one of the two first source-drain electrode patterns SD1 (corresponding to the second node N2 of the driving transistor DRT in the subpixel SP of FIG. 3) through a contact hole formed in the first planarization layer PLN1. Also, the second planarization layer PLN2 can be disposed to cover the second source-drain electrode pattern SD2, and a light emitting element ED can be disposed on the second planarization layer PLN2.

According to an example stack structure of the light emitting element ED, an anode electrode AE can be disposed on the second planarization layer PLN2. The anode electrode AE can also be electrically connected to the second source-drain electrode pattern SD2 through a contact hole formed in the second planarization layer PLN2.

Further, a bank BANK can be disposed to cover a portion of the anode electrode AE, and a portion of the bank BANK corresponding to a light emitting area EA of the subpixel SP can be opened. A portion of the anode electrode AE can thus be exposed through the opening (the opened portion) of the bank BANK. An emission layer EL can also be positioned on side surfaces of the bank BANK and in the opening (the opened portion) of the bank BANK. All or at least a portion of the emission layer EL can be located between adjacent banks.

In the opening of the bank BANK, the emission layer EL can contact the anode electrode AE. A cathode electrode CE can thus be disposed on the emission layer EL. Further, the light emitting element ED can be formed by including the anode electrode AE, the emission layer EL, and the cathode electrode CE, as described above. The emission layer EL can also include an organic material layer.

In addition, an encapsulation layer ENCAP can be disposed on the stack of the light emitting element ED. The encapsulation layer ENCAP can have a single-layer structure or a multi-layer structure. For example, as shown in FIGS. 6 and 7, the encapsulation layer ENCAP can include a first encapsulation layer PAS1, a second encapsulation layer PCL, and a third encapsulation layer PAS2.

The first encapsulation layer PAS1 and the third encapsulation layer PAS2 can be, for example, an inorganic material layer, and the second encapsulation layer PCL can be, for example, an organic material layer. Among the first encapsulation layer PAS1, the second encapsulation layer PCL, and the third encapsulation layer PAS2, the second encapsulation layer PCL can be the thickest and serve as a planarization layer.

In addition, the first encapsulation layer PAS1 can be disposed on the cathode electrode CE and be disposed closest to the light emitting element ED. The first encapsulation layer PAS1 can include an inorganic insulating material for being deposited using low-temperature deposition. For example, the first encapsulation layer PAS1 can include, but not limited to, silicon nitride (SiNx), silicon oxide (SiOx), silicon oxynitride (SiON), aluminum oxide (Al2O3), or the like. Because the first encapsulation layer PAS1 can be deposited in a low temperature atmosphere, during the deposition process, the first encapsulation layer PAS1 can prevent the emission layer EL including an organic material vulnerable to a high temperature atmosphere from being damaged.

The second encapsulation layer PCL can also have a smaller area or size than the first encapsulation layer PAS1. For example, the second encapsulation layer PCL can be disposed to expose both ends or edges of the first encapsulation layer PAS1. The second encapsulation layer PCL can also serve as a buffer for relieving stress between corresponding layers while the display device 100 is curved or bent, and serve to enhance planarization performance. For example, the second encapsulation layer PCL can include an organic insulating material, such as acrylic resin, epoxy resin, polyimide, polyethylene, silicon oxycarbon (SiOC), or the like. The second encapsulation layer PCL can also be disposed, for example, using an inkjet scheme.

The third encapsulation layer PAS2 can be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can thus minimize or prevent external moisture or oxygen from penetrating into the first encapsulation layer PAS1 and the second encapsulation layer PCL. For example, the third encapsulation layer PAS2 can include an inorganic insulating material, such as silicon nitride (SiNx), silicon oxide (SiOx), silicon oxynitride (SiON), aluminum oxide (Al2O3), or the like.

In addition, a touch sensor TS can be disposed on the encapsulation layer ENCAP. The structure of the touch sensor will be described in detail as follows. A first insulating layer 610 (touch buffer layer) can be disposed on the encapsulation layer ENCAP, and the touch sensor TS can be disposed on the first insulating layer 610. The touch sensor TS can include touch sensor metals TSM and at least one bridge metal BRG, which are located in different layers.

A second insulating layer 620 (touch interlayer insulating layer) can be disposed between the touch sensor metals TSM and the bridge metal BRG. For example, the touch sensor metals TSM can include a first touch sensor metal TSM, a second touch sensor metal TSM, and a third touch sensor metal TSM, which are disposed adjacent to one another. When the third touch sensor metal TSM is disposed between the first touch sensor metal TSM and the second touch sensor metal TSM, and the first touch sensor metal TSM and the second touch sensor metal TSM need to be electrically connected to each other, the first touch sensor metal TSM and the second touch sensor metal TSM can be electrically connected to each other through the bridge metal BRG located in a different layer. The bridge metal BRG can be electrically insulated from the third touch sensor metal TSM by the second insulating layer 620.

While the touch sensor TS is disposed on the display panel 110, a chemical solution (e.g., a developer or etchant) used in the corresponding process or moisture from the outside can be generated or introduced. In addition, by disposing the touch sensor TS on the first insulating layer 610, a chemical solution or moisture can be prevented from penetrating into the emission layer EL including an organic material during the manufacturing process of the touch sensor TS. Accordingly, the first insulating layer 610 can prevent damage to the emission layer EL, which is vulnerable to a chemical solution or moisture.

To prevent damage to the emission layer EL including an organic material, which is vulnerable to high temperatures, the first insulating layer 610 can be formed at a low temperature less than or equal to a predetermined temperature (e.g., 100° C.) and using an organic insulating material having a low permittivity of 1 to 3. For example, the first insulating layer 610 can include an acrylic-based, epoxy-based, or siloxan-based material. As the display device 100 is bent, the encapsulation layer ENCAP can be damaged, and the touch sensor metal located on the first insulating layer 610 can be cracked or broken. Even when the display device 100 is bent, the first insulating layer 610 including the organic insulating material and having the planarization performance can prevent the damage of the encapsulation layer ENCAP and/or the cracking or breaking of the metals (TSM, BRG) included in the touch sensor TS.

A protective layer PAC can also be disposed to cover the touch sensor TS. The protective layer PAC can be, for example, an organic insulating layer. In the normal area NA, a thickness T1 of the first insulating layer 610 is smaller than a thickness T2 of the second insulating layer 620.

Next, a stack structure of the first optical area OA1 will be described with reference to FIGS. 6 and 7. Referring to FIGS. 6 and 7, the light emitting area EA of the first optical area OA1 can have the same stack structure as that in the normal area NA. Accordingly, a stack structure of the first transmission area TA1 of the first optical area OA1 will be described in detail below.

In addition, the cathode electrode CE can be disposed in the light emitting areas EA included in the normal area NA and the first optical area OA1, but not be disposed in the first transmission area TA1. For example, the first transmission area TA1 of the first optical area OA1 can correspond to an opening of the cathode electrode CE.

Further, a light shield layer LS including at least one of the first metal layer ML1 and the second metal layer ML2 can be disposed in the light emitting areas EA included in the normal area NA and the first optical area OA1, but not be disposed in the first transmission area TA1 of the first optical area OA1. For example, the first transmission area TA1 can correspond to an opening of the light shield layer LS.

In addition, the substrate SUB and the various types of insulating layers (MBUF, ABUF1, ABUF2, GI, ILD1, ILD2, PAS0, PLN (PLN1, PLN2), BANK, ENCAP (PAS1, PCL, PAS2), 610, 620, PAC) disposed in the light emitting areas EA included in the normal area NA and the first optical area OA1 can be disposed in the first transmission area TA1 in the first optical area OA1 equally, substantially equally, or similarly. However, all, or one or more, of one or more material layers having electrical properties (e.g., one or more metal material layers, and/or one or more semiconductor layers), except for the insulating materials or layers, disposed in the light emitting areas EA included in the normal area NA and the first optical area OA1 may not be disposed in the first transmission area TA1 in the first optical area OA1. For example, referring to FIGS. 6 and 7, all, or one or more, of the metal material layers (ML1, ML2, GATE, GM, TM, SD1, SD2) related to at least one transistor and the active layer ACT may not be disposed in the first transmission area TA1.

As shown in FIGS. 6 and 7, the anode electrode AE and the cathode electrode CE included in the light emitting element ED is not disposed in the first transmission area TA1. In addition, the emission layer EL of the light emitting element ED may or may not be disposed in the first transmission area TA1 according to a design requirement. Referring to FIGS. 6 and 7, the touch sensor metal TSM and the bridge metal BRG included in the touch sensor TS may not be disposed in the first transmission area TA1 of the first optical area OA1.

Accordingly, the light transmittance of the first transmission area TA1 in the first optical area OA1 can be provided or improved because the material layers (e.g., one or more metal material layers, and/or one or more semiconductor layers) having electrical properties are not disposed in the first transmission area TA1 in the first optical area OA1. Thus, the first optical electronic device 11 can perform a predefined function (e.g., image sensing) by receiving light transmitting through the first transmission area TA1.

In addition, because all, or one or more, of the first transmission area TA1 in the first optical area OA1 overlap the first optical electronic device 11, to enable the first optical electronic device 11 to normally operate, it is preferable to further increase a transmittance of the first transmission area TA1 in the first optical area OA1. To achieve this, a transmittance improvement structure TIS can be provided to the first transmission area TA1 of the first optical area OA1.

Referring to FIGS. 6 and 7, the insulating layers included in the display panel 110 can include at least one buffer layer (MBUF, ABUF1, ABUF2) between at least one substrate (SUB1, SUB2) and at least one transistor (DRT, SCT), at least one planarization layers (PLN1, PLN2) between the transistor DRT and the light emitting element ED, at least one encapsulation layer ENCAP on the light emitting element ED, and the like. The insulating layers included in the display panel 110 can further include the first insulating layer 610, the second insulating layer 620 located on the encapsulation layer ENCAP, and the like.

As shown in FIGS. 6 and 7, the first transmission area TA1 in the first optical area OA1 can have a structure in which the first planarization layer PLN1 and the passivation layer PAS0 have depressed portions that extend downward from respective surfaces thereof as a transmittance improvement structure TIS. Among the insulating layers, the first planarization layer PLN1 can include at least one depression (e.g., a recess, a trench, a concave portion, a protrusion, or the like). The first planarization layer PLN1 can be, for example, an organic insulating layer.

When the first planarization layer PLN1 has the depressed portion extending downward from the surfaces thereof, the second planarization layer PLN2 can substantially serve to provide planarization. The second planarization layer PLN2 can also have a depressed portion extending downward from the surface thereof. In addition, the second encapsulation layer PCL provides planarization.

Referring to FIGS. 6 and 7, the depressed portions of the first planarization layer PLN1 and the passivation layer PAS0 pass through insulating layers, such as the first interlayer insulating layer ILD, the second interlayer insulating layer ILD2, the gate insulating layer GI, and the like, for forming the transistor DRT, and buffer layers, such as the first active buffer layer ABUF1, the second active buffer layer ABUF2, the multi-buffer layer MBUF, and the like, located under the insulating layers, and extend up to an upper portion of the second substrate SUB2.

As shown in FIGS. 6 and 7, the substrate SUB can include at least one concave portion or depressed portion as a transmittance improvement structure TIS. For example, in the first transmission area TA1, an upper portion of the second substrate SUB2 can be indented or depressed downward, or the second substrate SUB2 can be perforated.

Also, the first and second encapsulation layers PAS1 and PCL included in the encapsulation layer ENCAP can also have a transmittance improvement structure TIS in which the first encapsulation layer PAS1 and the second encapsulation layer PCL have depressed portions that extend downward from the respective surfaces thereof. The second encapsulation layer PCL can also be, for example, an organic insulating layer.

In addition, the substrate SUB may not include a concave portion in the first transmission area TA1, and the first and second encapsulation layers PAS1 and PCL can have a flat surface or a flat shape. To protect the touch sensor TS, the protective layer PAC can be disposed to cover the touch sensor TS on the encapsulation layer ENCAP. The protective layer PAC can have at least one depression (e.g., a recess, a trench, a concave portion, a protrusion, or the like) as a transmittance improvement structure TIS in a portion overlapping the first transmission area TA1. The protective layer PAC can be, for example, an organic insulating layer.

In addition, the touch sensor TS can include one or more touch sensor metals TSM with a mesh type. When the touch sensor metal TSM is formed in the mesh type, a plurality of openings are formed in the touch sensor metal TSM. Each of the openings can also be located to correspond to the light emitting area EA of the subpixel SP. So the first optical area OA1 has a transmittance greater than the normal area NA, an area or size of the touch sensor metal TSM per unit area in the first optical area OA1 can be smaller than an area or size of the touch sensor metal TSM per unit area in the normal area NA. In addition, the touch sensor TS can be disposed in the light emitting area EA of the first optical area OA1, but may not be disposed in the first transmission area TA1 of the first optical area OA1.

As shown in FIGS. 6 and 7, so the transmittance of the first optical area OA1 can be higher than that of the normal area NA, a thickness T3 of the first insulating layer 610 disposed in the first optical area OA1 can be smaller than a thickness T1 of the first insulating layer 610 disposed in the normal area NA, and a thickness T4 of the second insulating layer 620 disposed in the first optical area OA1 can be smaller than a thickness T2 of the second insulating layer 620 disposed in the normal area NA.

Also, each of the first and second insulating layers 610 and 620 can include silicon nitride (SixNy) and thus have a higher absorptivity for light having short wavelengths (e.g., 440 nm to 470 nm) compared with light in other visible light wavelength bands. Therefore, the first optical area OA1 including the first transmission areas TA1 having a high transmittance can be viewed in a yellowish color.

As described above, the display device 100 including the touch sensor TS can include at least one of the first insulating layer 610 and the second insulating layer 620. When display device 100 includes at least one of the first insulating layer 610 and the second insulating layer 620, it is preferable to improve the transmittance of the first optical area OA1, or the transmittance of the first optical area OA1 and at least a portion of the remaining area except for the first optical area OA1 in the display area DA.

In addition, to increase the transmittance of the first optical area OA1 for light having short wavelengths, so that the transmittance of the first optical area OA1 can be higher than that of the normal area NA, a thickness T3 of the first insulating layer 610 disposed in the first optical area OA1 can be smaller than a thickness T1 of the first insulating layer 610 disposed in the normal area NA, and a thickness T4 of the second insulating layer 620 disposed in the first optical area OA1 can be smaller than a thickness T2 of the second insulating layer 620 disposed in the normal area NA.

For example, the thickness T2 of the second insulating layer 620 located in the normal area NA can be two times the thickness T1 of the first insulating layer 610 therein. In the normal area NA, the thickness T2 of the second insulating layer 620 can be 4000 Å, and the thickness T1 of the first insulating layer 610 can be 2000 Å. However, the thicknesses of the first and second insulating layer 610 and 620 in the normal area NA according to embodiments of the present disclosure are not limited thereto.

In addition, the thickness T4 of the second insulating layer 620 located in the first optical area OA1 can be greater than 2 times the thickness T3 of the first insulating layer 610 therein, and be less than or equal to 2.5 times the thickness T3 of the first insulating layer 610 therein. For example, in the first optical area OA1, the thickness T4 of the second insulating layer 620 can be 3000 Å, and the thickness T2 of the first insulating layer 610 can be 1300 Å. However, the thicknesses of the first and second insulating layer 610 and 620 in the first optical area OA1 according to embodiments of the present disclosure are not limited thereto. As described above, the first insulating layer 610 and the second insulating layer 620 disposed in the normal area NA, the first optical area OA1, and the second optical area OA2 can include silicon nitride (SixNy).

To increase the transmittance of the normal area NA, the first optical area OA1, and the second optical area OA2, a composition ratio (atomic %) of the number of atoms of each of the first insulating layer 610 and the second insulating layer 620 can be expressed by Equation 1.

$$N \geq Si \quad \text{(Equation 1)}$$

For example, a composition ratio (atomic %) of the number of atoms of nitrogen (N) included in each of the first insulating layer 610 and the second insulating layer 620 can be greater than or equal to a composition ratio (atomic %) of the number of atoms of silicon (Si). In addition, the composition ratio (atomic %) of the number of atoms of nitrogen (N) included in each of the first insulating layer 610 and the second insulating layer 620 can be 50% to 52%, and the composition ratio of the number of atoms of silicon (Si) included in each of the first insulating layer 610 and the second insulating layer 620 can be 48% to 50%. However, embodiments of the present disclosure are not limited thereto.

Also, the gas used in the process of forming the first insulating layer 610 and the second insulating layer 620 can include NH3 gas and SiH4 gas. A flow rate (NH3/SiH4) of the gas used in the process of forming the first insulating layer 610 and the second insulating layer 620 to obtain a composition ratio of the number of atoms satisfying Equation 1 can be 0.85 to 1.2.

As described above, by adjusting the composition ratio of the number of atoms of nitrogen (N) and the composition ratio of the number of atoms of silicon (Si) included in the first insulating layer 610 and the second insulating layer 620, not only the transmittance of the first optical area OA1, but the transmittance of the normal area NA and the second optical area OA2 can be improved.

Next, a stack structure of the second optical area OA2 will be described with reference to FIGS. 6 and 7. As shown, the light emitting area EA of the second optical area OA2 can have the same stack structure as that of the normal area NA. Accordingly, only a stack structure of the second transmission area TA2 in the second optical area OA2 will be described in detail below.

In addition, the cathode electrode CE can be disposed in the light emitting areas EA included in the normal area NA and the second optical area OA2, but may not be disposed in the second transmission area TA2 in the second optical area OA2. For example, the second transmission area TA2 in the second optical area OA2 can correspond to an opening of the cathode electrode CE.

In addition, the light shield layer LS including at least one of the first metal layer ML1 and the second metal layer ML2 can be disposed in the light emitting areas EA included in the normal area NA and the second optical area OA2, but may not be disposed in the second transmission area TA2 in the second optical area OA2. For example, the second transmission area TA2 in the second optical area OA2 can correspond to an opening of the light shield layer LS.

When the transmittance of the second optical area OA2 and the transmittance of the first optical area OA1 are the same, the stack structure of the second transmission area TA2 in the second optical area OA2 can be the same as the stacked structure of the first transmission area TA1 in the first optical area OA1. When the transmittance of the second optical area OA2 and the transmittance of the first optical area OA1 are different, the stack structure of the second transmission area TA2 in the second optical area OA2 can be different at least in part from as the stacked structure of the first transmission area TA1 in the first optical area OA1.

For example, as shown in FIGS. 6 and 7, when the transmittance of the second optical area OA2 is lower than the transmittance of the first optical area OA1, the second transmission area TA2 in the second optical area OA2 may not have a transmittance improvement structure TIS. Thus, the first planarization layer PLN1 and the passivation layer PAS0 are not indented or depressed. Also, a width of the second transmission area TA2 in the second optical area OA2 can be smaller than a width of the first transmission area TA1 in the first optical area OA1.

In addition, the substrate SUB and the various types of insulating layers (MBUF, ABUF1, ABUF2, GI, ILD1, ILD2, PAS0, PLN (PLN1, PLN2), BANK, ENCAP (PAS1, PCL, PAS2), 610, 620, PAC) disposed in the light emitting areas EA included in the normal area NA and the first optical area OA2 can be disposed in the second transmission area TA2 of the second optical area OA2 equally, substantially equally, or similarly.

However, all, or one or more, of one or more material layers having electrical properties (e.g., one or more metal material layers, and/or optical area semiconductor layers), except for the insulating materials or layers, disposed in the light emitting areas EA included in the normal area NA and the second optical area OA2 may not be disposed in the second transmission area TA2 in the second optical area OA2. For example, referring to FIGS. 6 and 7, all, or one or more, of the metal material layers (ML1, ML2, GATE, GM, TM, SD1, SD2) related to at least one transistor and the active layer ACT are not disposed in the second transmission area TA2 in the second optical area OA2.

Further, referring to FIGS. 6 and 7, the anode electrode AE and the cathode electrode CE included in the light emitting element ED may not be disposed in the second transmission area TA2. In addition, the emission layer EL of the light emitting element ED may or may not be disposed on the second transmission area TA2 according to a design requirement. The touch sensor metal TSM and the bridge metal BRG included in the touch sensor TS may also not be disposed in the second transmission area TA2 in the second optical area OA2.

Accordingly, the light transmittance of the second transmission area TA2 in the second optical area OA2 can be provided or improved because the material layers (e.g., one or more metal material layers, and/or one or more semiconductor layers) having electrical properties are not disposed in the second transmission area TA2 in the second optical area OA2. Thus, the second optical electronic device 12 can perform a predefined function (e.g., detecting an object or human body, or an external illumination detection) by receiving light transmitting through the second transmission area TA2.

In addition, as shown in FIG. 6, a thickness T5 of the first insulating layer 610 located in the second optical area OA2 can correspond to the thickness T1 of the first insulating layer 610 located in the normal area NA. Also, a thickness T6 of the second insulating layer 620 located in the second optical area OA2 can correspond to the thickness T2 of the second insulating layer 620 located in the normal area NA. In this example, the transmittance of the first optical area OA1 for light having short wavelengths (e.g., 440 nm to 470 nm) can be higher than the transmittance of the second optical area OA2 for the light having the short wavelengths.

However, embodiments of the present disclosure are not limited thereto. For example, as shown in FIG. 7, the thickness T5 of the first insulating layer 610 located in the second optical area OA2 can correspond to the thickness T3 of the first insulating layer 610 located in the first optical area OA1. The thickness T6 of the second insulating layer 620 located in the second optical area OA2 can also correspond to the thickness T4 of the second insulating layer 620 located in the first optical area OA1.

In this example, the transmittance of the first optical area OA1 for light having short wavelengths (e.g., 440 nm to 470 nm) can correspond to the transmittance of the second optical area OA2 for the light having the short wavelengths. Accordingly, when the second optical area OA2 needs to have the transmittance of the first optical area OA1 for light having a short wavelengths, as shown in FIG. 7, the thicknesses T5 and T6 of the first and second insulating layers 610 and 620 disposed in the second optical area OA2 can be configured to correspond to thicknesses T3 and T4 of the first and second insulating layers 610 and 620 disposed in the first optical area OA1, respectively. As shown in FIGS. 6 and 7, the first and second insulating layers 610 and 620 having different thicknesses for each area can be formed using first and second masks, and thereby, the process of forming these insulating layers can be simplified.

Figure 8:
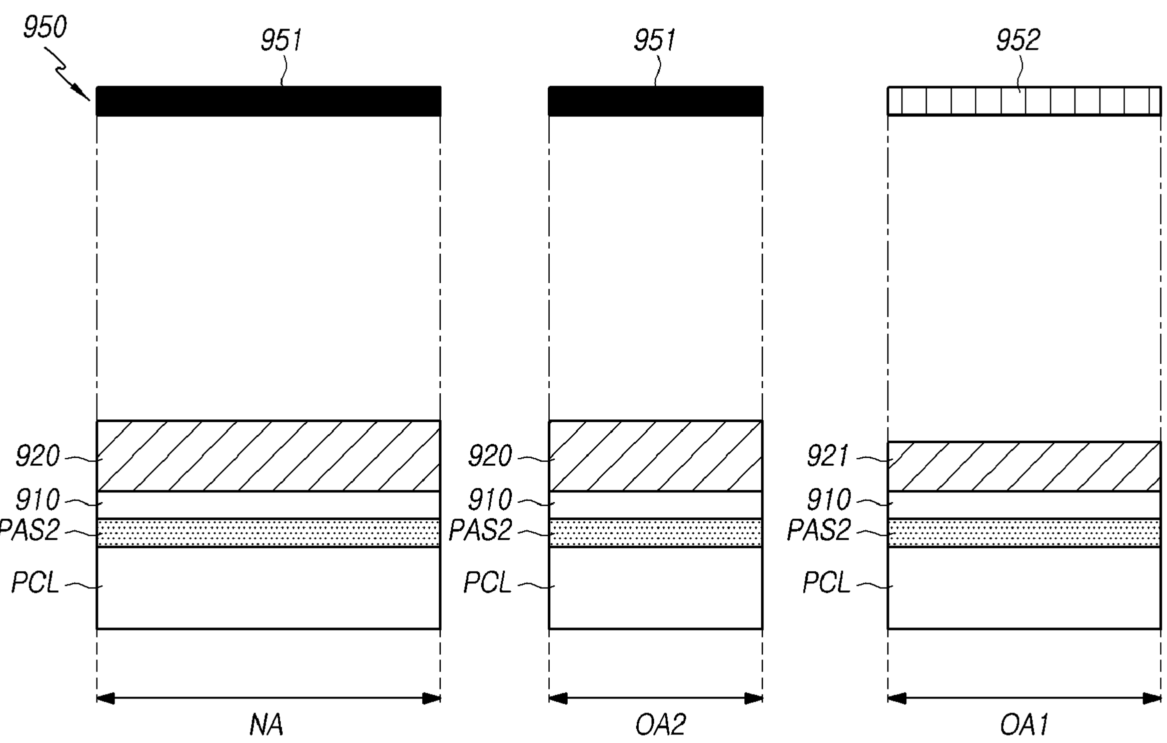
FIGS. 8, 9, 10 and 11 are overviews illustrating processes for forming the first and second insulating layers included in the display device of FIG. 6.

Hereinafter, embodiments of the present disclosure related to the foregoing will be discussed with reference to FIGS. 8-11, which schematically illustrate processes for forming the first and second insulating layers included in the display device of FIG. 6. Referring first to FIG. 8, in the normal area NA, the first optical area OA1, and the second optical area OA2, and a first insulating layer material 910 are disposed over a substrate over which a second encapsulation layer PCL and a third encapsulation layer PAS2 are disposed. A photoresist is also disposed on the first insulating layer material 910.

The photoresist disposed on the first insulating layer material 910 can be photoresist that is cured as light is irradiated. As shown, a first mask 950 is disposed to face the substrate over which the photoresist is disposed. In addition, the first mask 950 can include a first area 951 and a second area 952.

In a photolithography process, the first area 951 can be an area through which light may not transmit, and an amount of light transmitting the second area 952 can be greater than an amount of light transmitting the first area 951. In this example, an amount of light transmitting the second area 952 can be less than an amount of incident light (i.e., less than 100%).

In addition, the normal area NA and the second optical area OA2 can correspond to the first area 951 of the first mask 950, and the first optical area OA1 can correspond to the second area 952 of the first mask 950. The photoresist can be patterned by irradiating light toward the first mask 950. As shown in FIG. 8, a first photoresist can be formed in an area corresponding to the first area 951 of the first mask 950, and a second photoresist having a height lower than the first photoresist can be formed in an area corresponding to the second area 952 of the first mask 950. Thereafter, the second photoresist can be removed. In this process, the height of the first photoresist can be lowered by the height of the second photoresist.

After the photolithography process, the second photoresist may not be provided over the first insulating layer material 910 disposed in the first optical area OA1, and the first photoresist can be provided over the first insulating layer material 910 disposed in the normal area NA and the second optical area OA2. Thereafter, the first insulating layer material 910 can be etched using the first photoresist as a mask.

Because the first photoresist is provided in the normal area NA and the second optical area OA2 in which the first photoresist is disposed, the first insulating layer material 910 is not etched. The first insulating layer material 910 in the first optical area OA1 in which the photoresist is not provided can be partially etched. Thereafter, the first photoresist disposed in the normal area NA and the second optical area OA2 can be removed.

Figure 9:
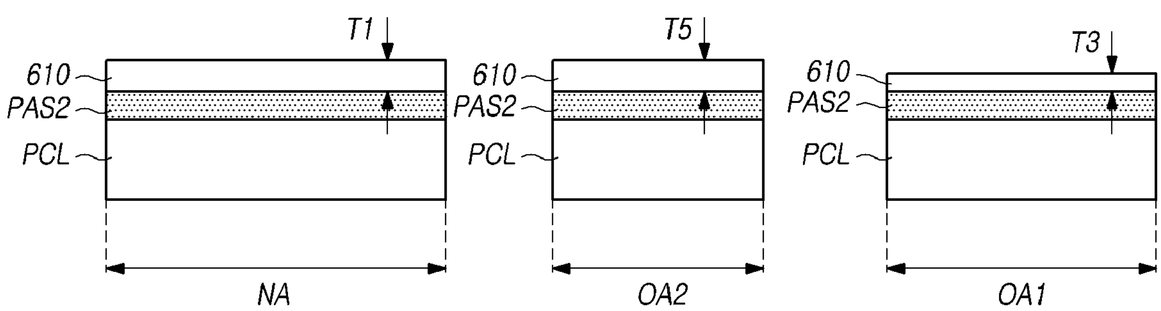

Accordingly, as shown in FIG. 9, the first insulating layer 610 can be provided in each of the normal area NA, the first optical area OA1, and the second optical area OA2. Respective heights T1 and T5 of the first insulating layer 610 disposed in the normal area NA and the second optical area OA2 also correspond to each other. In one embodiment, a height T3 of the first insulating layer 610 disposed in the first optical area OA1 can be smaller than respective thicknesses T1 and T5 of the first insulating layer 610 disposed in the normal area NA and the second optical area OA2.

Figure 10:
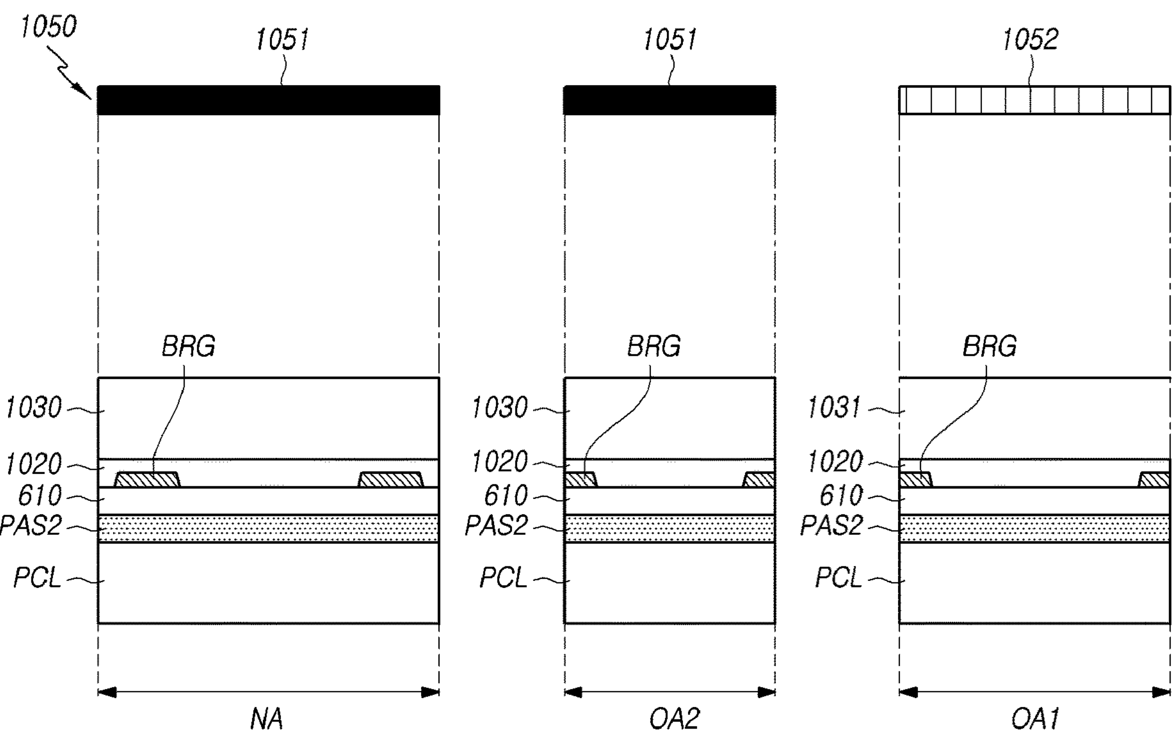

As shown in FIG. 10, a bridge metal BRG can be disposed on the first insulating layer 610, and a second insulating layer material 1020 can be disposed on the bridge metal BRG and the first insulating layer 610. The second insulating layer material 1020 can be disposed in the normal area NA, the first optical area OA1, and the second optical area OA2. Also, a photoresist can be disposed on the second insulating layer material 1020.

In addition, the photoresist disposed on the second insulating layer material 1020 is a photoresist that is cured as light is irradiated. As shown, a second mask 1050 is disposed to face the substrate over which the photoresist is disposed. The second mask 1050 can include a third area 1051 and a fourth area 1052. In a photolithography process, the third area 1051 can be an area through which light may not transmit, and an amount of light transmitting the fourth area 1052 can be greater than an amount of light transmitting the third area 1051. In this example, an amount of light transmitting the fourth area 1052 can be less than an amount of incident light (i.e., less than 100%).

In addition, the normal area NA and the second optical area OA2 can correspond to the third area 1051 of the second mask 1050, and the first optical area OA1 can correspond to the fourth area 1052 of the second mask 1050. The photoresist can thus be patterned by irradiating light toward the second mask 1050.

As shown in FIG. 10, a third photoresist can be formed in an area corresponding to the third area 1051 of the second mask 1050, and a fourth photoresist having a height lower than the third photoresist can be formed in an area corresponding to the fourth area 1052 of the second mask 1050. Thereafter, the fourth photoresist can be removed. In this process, the height of the third photoresist can be lowered by the height of the fourth photoresist.

After the photolithography process, the fourth photoresist is not provided over the second insulating layer material 1020 disposed in the first optical area OA1, and the third photoresist is provided over the second insulating layer material 1020 disposed in the normal area NA and the second optical area OA2. Thereafter, the second insulating layer material 1020 can be etched using the third photoresist as a mask.

Because the third photoresist is provided in the normal area NA and the second optical area OA2 in which the third photoresist is disposed, the second insulating layer material 1020 is not etched. In addition, the second insulating layer material 1020 in the first optical area OA1 in which the photoresist is not provided can be partially etched.

Figure 11:
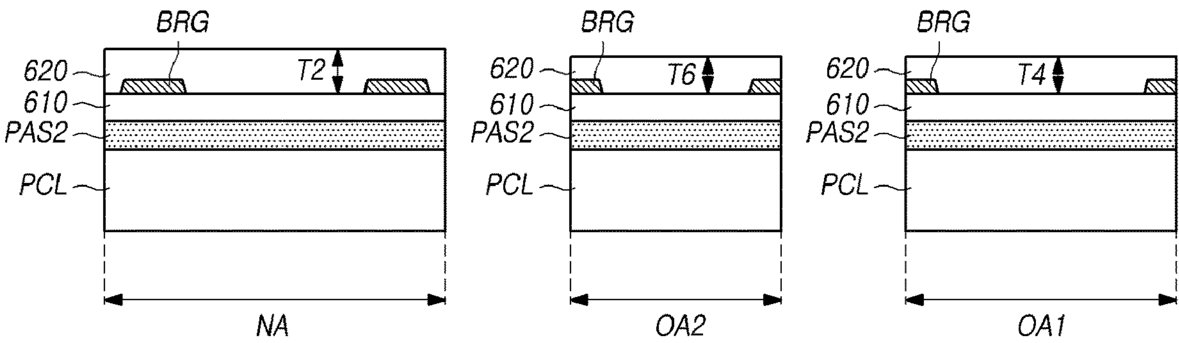

Thereafter, the first photoresist disposed in the normal area NA and the second optical area OA2 can be removed. Accordingly, as shown in FIG. 11, the second insulating layer 620 can be provided in each of the normal area NA, the first optical area OA1, and the second optical area OA2. Respective heights T2 and T6 of the second insulating layer 620 disposed in the normal area NA and the second optical area OA2 also correspond to each other.

In an embodiment, a height T4 of the second insulating layer 620 disposed in the first optical area OA1 can be smaller than respective thicknesses T2 and T6 of the second insulating layer 620 disposed in the normal area NA and the second optical area OA2. In addition, a contact hole through which the bridge metal BRG and a touch sensor metal contact each other can be formed in the second insulating layer 620. Through this process, as shown in the structure shown in FIG. 6, the respective thicknesses of the first insulating layer 610 and the second insulating layer 620 disposed in the normal area NA and the second optical area OA2 can be greater than the respective thicknesses of the first insulating layer 610 and the second insulating layer 620 disposed in the first optical area OA1.

Further, by forming the first insulating layer 610 using one first mask 950 including the first area 951 and the second area 952, and forming the second insulating layer 620 using one second mask 1050 including the third area 1051 and the fourth area 1052, the process can be simplified for forming the first and second insulating layers 610 and 620 disposed in the normal area NA, the first optical area OA1, and the second optical area OA2.

Figure 12:
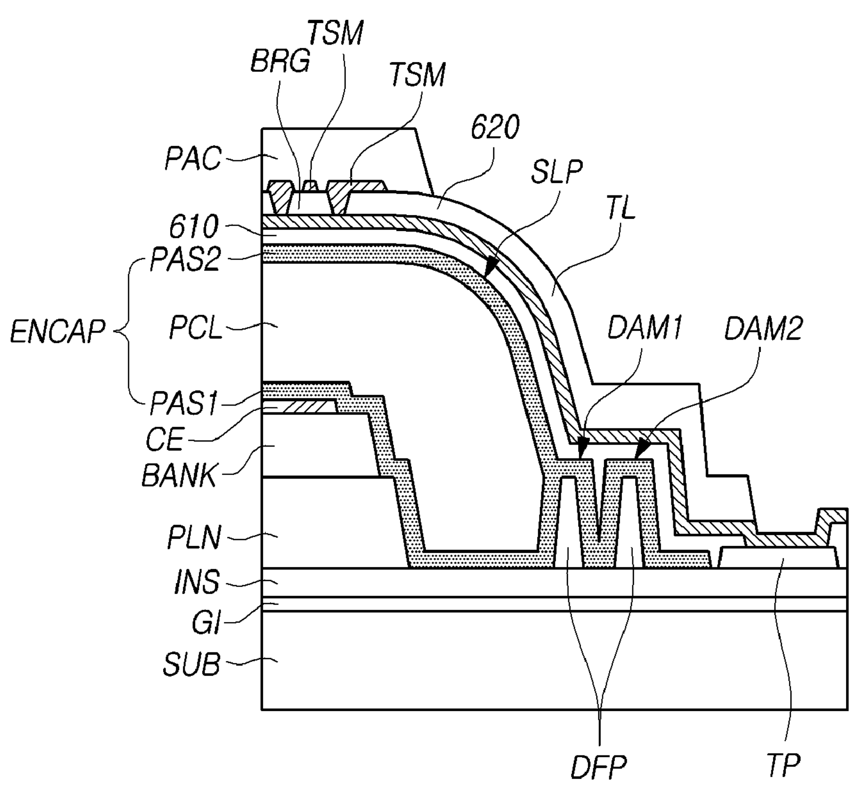
FIG. 12 is a cross-sectional view of an edge of the display panel according to an aspect of the present disclosure.

Next, FIG. 12 is a cross-sectional view of an edge of the display panel 110 according to an aspect of the present disclosure. Also, in FIG. 12, a single substrate SUB including the first substrate SUB1 and the second substrate SUB2 is illustrated, and layers or portions located under the bank BANK are illustrated in a simplified manner. In the same manner, FIG. 12 illustrates a single planarization layer PLN including the first planarization layer PLN1 and the second planarization layer PLN2, and a single interlayer insulating layer INS including the second interlayer insulating layer ILD2 and the first interlayer insulating layer ILD1 located under the planarization layer PLN.

Referring to FIG. 12, the first encapsulation layer PAS1 can be disposed on the cathode electrode CE and disposed closest to the light emitting element ED. The second encapsulation layer PCL can also have a smaller area or size than the first encapsulation layer PAS1. For example, the second encapsulation layer PCL can be disposed to expose both ends or edges of the first encapsulation layer PAS1.

In addition, the third encapsulation layer PAS2 can be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can thus minimize or prevent external moisture or oxygen from penetrating into the first encapsulation layer PAS1 and the second encapsulation layer PCL.

Referring to FIG. 12, to prevent the encapsulation layer ENCAP from collapsing, the display panel 110 can include one or more dams (DAM1 and/or DAM2) at, or near to, an end or edge of an inclined surface SLP of the encapsulation layer ENCAP. The one or more dams DAM1 and/or DAM2 can be present at, or near to, a boundary point between the display area DA and the non-display area NDA. The one or more dams DAM1 and/or DAM2 can include the same material DFP as the bank BANK.

Referring to FIG. 12, in one embodiment, the second encapsulation layer PCL including an organic material can be located only on an inner side of a first dam DAM1, which is located closest to the inclined surface SLP of the encapsulation layer ENCAP among the dams. For example, the second encapsulation layer PCL may not be located on all of the dams (DAM1 and DAM2). In another embodiment, the second encapsulation layer PCL including an organic material can be located on at least the first dam DAM1 of the first dam DAM1 and a second dam DAM2.

For example, the second encapsulation layer PCL can extend only up to all, or at least a portion, of an upper portion of the first dam DAM1. In further another embodiment, the second encapsulation layer PCL can extend past the upper portion of the first dam DAM1 and extend up to all, or at least a portion of, an upper portion of the secondary dam DAM2. Referring to FIG. 12, a touch pad TP, to which the touch driving circuit 260 is electrically connected, can be disposed in a portion of the substrate SUB outside of the one or more dams (DAM1 and/or DAM2).

Further, a touch line TL can electrically connect, to the touch pad TP, the touch sensor metal TSM or the bridge metal BRG included in, or serving as, a touch electrode disposed in the display area DA. One end or edge of the touch line TL can be electrically connected to the touch sensor metal TSM or the bridge metal BRG, and the other end or edge of the touch line TL can be electrically connected to the touch pad TP.

In addition, the touch line TL can run downward along the inclined surface SLP of the encapsulation layer ENCAP, run along the respective upper portions of the one or more dams (DAM1 and/or DAM2), and extend up to the touch pad TP disposed outside of the one or more dams (DAM1 and/or DAM2). Referring to FIG. 12, the touch line TL can be the bridge metal BRG. In another embodiment, the touch line TL can be the touch sensor metal TSM.

Next, FIG. 13 illustrates yellow indexes and transmittances in short wavelengths of display devices between different examples. In particular, FIG. 13 is a table representing yellow indexes and transmittances in short wavelengths of display devices between Comparative Examples 1 and 2 and Examples 1 and 2 according to the present disclosure.

In FIG. 13, display devices according to Comparative Examples 1 and 2 can include a first insulating layer with a uniform thickness and a second insulating layer with a uniform thickness in a normal area NA, a first optical area OA1, and a second optical area OA2. In Comparative Examples 1 and 2, a thickness of the first insulating layer can be 2000 Å, and a thickness of the second insulating layer can be 4000 Å.

In FIG. 13, display devices according to Examples 1 and 2 have the structure of FIG. 6. In the normal area NA and the second optical area OA2, a thickness of the first insulating layer can be 2000 Å, and a thickness of the second insulating layer can be 4000 Å. In the first optical area OA1, a thickness of the first insulating layer can be 1300 Å, and a thickness of the second insulating layer can be 3000 Å.

In the display devices according to Comparative Examples 1 and 2, a flow rate (NH3/SiH4) of gas used in the process of forming the first insulating layer and the second insulating layer can be 0.93, and in the display device according to Comparative Example 2 and Example 2, a flow rate (NH3/SiH4) of gas used in the process of forming the first insulating layer and the second insulating layer is 1.19.

Yellow indexes of the display devices according to Examples 1 and 2 of FIG. 13 are lower than yellow indexes of the display devices according to Comparative Examples 1 and 2. Further, a transmittance of the display device according to Comparative Example 1 for light having wavelengths of 430 nm and 470 nm are lower than a transmittance of the display device according to Example 1 for light having wavelengths of 430 nm and 470 nm.

In addition, a transmittance of the display device according to Comparative Example 2 for light having wavelengths of 430 nm and 470 nm is lower than a transmittance of the display device according to Example 2 for light having wavelengths of 430 nm and 470 nm. Thus, because the thickness of the second insulating layer in the first optical area OA1 is greater than two times the thickness of the first insulating layer and less than or equal to 2.5 times the thickness of the first insulating layer, a high transmittance for incident light over short wavelengths can be achieved.

Embodiments of the present disclosure provide a display device including a display panel with a display area DA having a first optical area OA1 and a normal area NA located outside of the first optical area OA1, and a non-display area NDA, wherein the first optical area OA1 includes a plurality of light emitting areas EA and a plurality of first transmission areas TA1, and the normal area NA includes a plurality of light emitting areas EA; and a first optical electronic device 11 that is located under, or in a lower portion of, the display panel and overlaps at least a portion of the first optical area OA1 included in the display area DA. The display panel includes organic light emitting elements ED disposed in the first optical area OA1 and the normal area NA, an encapsulation layer ENCAP disposed on at least one of the organic light emitting elements ED, a first insulating layer 610 disposed on the encapsulation layer ENCAP, a touch sensor (e.g., a bridge metal BRG included in the touch sensor) disposed on the first insulating layer 610, and a second insulating layer 620 disposed on the touch sensor (e.g., the bridge metal BRG included in the touch sensor). Respective thicknesses (T1 and T3) of the first insulating layer 610 in the normal area NA and the first optical area OA1 are smaller than respective thicknesses (T2 and T4) of the second insulating layer 620 in the normal area NA and the first optical area OA1. The thickness T1 of the first insulating layer 610 disposed in the normal area NA are greater than the thickness T3 of the first insulating layer 610 disposed in the first optical area OA1. The thickness T2 of the second insulating layer 620 disposed in the normal area NA are greater than the thickness T4 of the second insulating layer 620 disposed in the first optical area OA1.

The thickness T4 of the second insulating layer 620 in the first optical area OA1 is also greater than 2 times the thickness T3 of the first insulating layer 610 therein, and less than or equal to 2.5 times the thickness T3 of the first insulating layer 610 therein. The thickness T2 of the second insulating layer 620 in the normal area NA can be two times the thickness T1 of the first insulating layer 610 therein.

The display area DA may further include a second optical area OA2 different from the first optical area OA1 and the normal area NA. The display device may further include a second optical electronic device 12 located under, or in a lower portion of, the display panel DA, and overlapping at least a portion of the second optical area OA2. The normal area NA can be or may not be disposed between the first and second optical areas OA1 and OA2.

A thickness T1 of the first insulating layer 610 disposed in the normal area NA is greater than a thickness T5 of the first insulating layer 610 disposed in the second optical area OA2, and a thickness T2 of the second insulating layer 620 disposed in the normal area NA is greater than a thickness T6 of the second insulating layer 620 disposed in the second optical area OA2. Further, the thickness T5 of the first insulating layer 610 disposed in the second optical area OA2 corresponds to the thickness T3 of the first insulating layer 610 disposed in the first optical area OA1, and the thickness T6 of the second insulating layer 620 disposed in the second optical area OA2 corresponds to the thickness T4 of the second insulating layer 620 disposed in the first optical area OA1.

Further, the thickness T5 of the first insulating layer 610 disposed in the second optical area OA2 can correspond to the thickness T1 of the first insulating layer 610 disposed in the normal area NA, and the thickness T6 of the second insulating layer 620 disposed in the second optical area OA2 can correspond to the thickness T2 of the second insulating layer 620 disposed in the normal area NA. In one embodiment, the first optical electronic device 11 can be a camera, and the second optical electronic device 12 can be a sensor such as a proximity sensor, an illuminance sensor, and the like Each of the first insulating layer 610 and the second insulating layer 620 can include silicon nitride (SixNy). Further, a composition ratio of the number of atoms of each of the first insulating layer 610 and the second insulating layer 620 can be expressed by Equation 1 below.

$$N \geq Si \quad \text{(Equation 1)}$$

The number of subpixels per unit area in the first optical area OA1 can be less than the number of subpixels per unit area in the normal area NA, and the number of subpixels per unit area in the second optical area OA2 can be greater than or equal to the number of subpixels per unit area in the first optical area OA1. The display panel may further include a cathode electrode CE disposed in a plurality of light emitting areas EA included in the normal area NA and the first optical area OA1 and not disposed in a plurality of transmission areas TA1 in the first optical area OA1. The display panel may further include a light shield layer LS disposed under transistors in the light emitting areas EA and not disposed in the transmission areas (TA1 and/or TA2).

Embodiments of the present disclosure provide a display panel including a substrate SUB having a display area DA and a non-display area NDA, organic light emitting elements ED disposed over the substrate SUB in a first optical area OA1 and a normal area NA, an encapsulation layer ENCAP disposed on at least one of the organic light emitting elements ED, a first insulating layer 610 disposed on the encapsulation layer ENCAP, a touch sensor (e.g., a bridge metal BRG included in the touch sensor) disposed on the first insulating layer 610, and a second insulating layer 620 disposed on the touch sensor (e.g., the bridge metal BRG included in the touch sensor). The display area DA includes the first optical area OA1 at least partially overlapping a first optical electronic device 11 located under the substrate SUB, and the normal area located outside of the first optical area OA1. Respective thicknesses (T1 and T3) of the first insulating layer 610 in the normal area NA and the first optical area OA1 can be smaller than respective thicknesses (T2 and T4) of the second insulating layer 620 in the normal area NA and the first optical area OA1. The thickness T1 of the first insulating layer 610 disposed in the normal area NA can be greater than the thickness T3 of the first insulating layer 610 disposed in the first optical area OA1. The thickness T2 of the second insulating layer 620 disposed in the normal area NA can be greater than the thickness T4 of the second insulating layer 620 disposed in the first optical area OA1.

The above description has been presented to enable any person skilled in the art to make and use the invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. Although the exemplary embodiments have been described for illustrative purposes, a person skilled in the art will appreciate that various modifications and applications are possible without departing from the essential characteristics of the present disclosure. For example, the specific components of the exemplary embodiments can be variously modified. The above description and the accompanying drawings provide an example of the technical idea of the present invention for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure is to be construed according to the claims, and all technical ideas within the scope of the claims should be interpreted as being included in the scope of the present invention.

What is claimed is:

1. A display device comprising:

a display panel including a plurality of light emitting areas including a plurality of first light emitting areas and a plurality of third light emitting areas; and a first optical electronic device located under the display panel, wherein a first optical area of the display panel overlapping the first optical electronic device comprises a plurality of first light transmission areas and the plurality of first light emitting areas, wherein a third optical area of the display panel not overlapping the first optical electronic device includes the plurality of third light emitting areas without light transmission areas, and wherein the display panel comprises:

organic light emitting elements disposed in the first optical area and the third optical area and corresponding to the plurality of first light emitting areas and the plurality of third light emitting areas;

a driving transistor for driving an organic light emitting element of the organic light emitting elements in the third optical area;

a planarization layer between the driving transistor and the organic light emitting element in the third optical area;

an encapsulation layer disposed on the organic light emitting elements;

a first insulating layer disposed on the encapsulation layer;

a touch sensor disposed on the first insulating layer; and a second insulating layer disposed on the touch sensor, wherein a thickness of the first insulating layer in the third optical area is smaller than a thickness of the second insulating layer in the third optical area, and the thickness of the first insulating layer in the first optical area is smaller than the thickness of the second insulating layer in the first optical area, wherein the thickness of the first insulating layer disposed in the third optical area is greater than the thickness of the first insulating layer disposed in the first optical area, and the thickness of the second insulating layer disposed in the third optical area is greater than the thickness of the second insulating layer disposed in the first optical area, wherein the planarization layer is extended from the third optical area to the plurality of first light transmission areas of first optical area and disposed below the encapsulation layer, wherein the organic light emitting elements include an anode electrode, an emission layer, and a cathode electrode, and wherein the emission layer within a plurality of first transmission areas is separated from the emission layer within a plurality of third optical areas.

2. The display device according to claim 1, wherein the thickness of the second insulating layer in the first optical area is greater than 2 times the thickness of the first insulating layer in the first optical area, and less than or equal to 2.5 times the thickness of the first insulating layer in the first optical area.

3. The display device according to claim 1, wherein the thickness of the second insulating layer in the third optical area is 2 times the thickness of the first insulating layer in the third optical area.

4. The display device according to claim 1, further comprising:

a second optical electronic device located under the display panel, wherein the display panel further includes a plurality of second light emitting areas, wherein a second optical area of the display panel overlapping the second optical electronic device comprises a plurality of second light transmission areas and the plurality of second light emitting areas, and wherein the third optical area is disposed between the first optical area and the second optical area.

5. The display device according to claim 4, wherein the thickness of the first insulating layer disposed in the third optical area is greater than a thickness of the first insulating layer disposed in the second optical area, and the thickness of the second insulating layer disposed in the third optical area is greater than a thickness of the second insulating layer disposed in the second optical area.

6. The display device according to claim 5, wherein the thickness of the first insulating layer disposed in the second optical area corresponds to the thickness of the first insulating layer disposed in the first optical area, and the thickness of the second insulating layer disposed in the second optical area corresponds to the thickness of the second insulating layer disposed in the first optical area.

7. The display device according to claim 4, wherein the thickness of the first insulating layer disposed in the second optical area corresponds to the thickness of the first insulating layer disposed in the third optical area, and the thickness of the second insulating layer disposed in the second optical area corresponds to the thickness of the second insulating layer disposed in the third optical area.

8. The display device according to claim 4, wherein the first optical electronic device is a camera, and the second optical electronic device is a sensor.

9. The display device according to claim 4, wherein a number of subpixels per unit area in the first optical area is less than a number of subpixels per unit area in the third optical area, and a number of subpixels per unit area in the second optical area is greater than or equal to the number of subpixels per unit area in the first optical area.

10. The display device according to claim 1, wherein the first insulating layer and the second insulating layer comprises silicon nitride (SixNy).

11. The display device according to claim 10, wherein a composition ratio of a number of atoms of each of the first insulating layer and the second insulating layer is expressed by:

$$N \geq Si.$$

12. The display device according to claim 1, wherein the display panel further comprises a cathode electrode disposed in respective the plurality of light emitting areas, and not disposed in the first light transmission areas of the first optical area.

13. The display device according to claim 1, wherein the display panel further comprises a light shield layer disposed under transistors in respective the plurality of light emitting areas and not disposed in the first light transmission areas.

14. A display panel comprising:

a substrate including a display area having a plurality of organic light emitting elements corresponding to a plurality of light emitting areas including a plurality of first light emitting areas and a plurality of third light emitting areas, wherein a first optical area of the display area overlaps a first optical electronic device disposed under the display panel and comprises a plurality of first light transmission areas and the plurality of first light emitting areas, and wherein a third optical area of the display panel not overlapping the first optical electronic device includes the plurality of third light emitting areas without including light transmission areas;

a driving transistor for driving an organic light emitting element of the plurality of organic light emitting elements in the third optical area;

a planarization layer between the driving transistor and the organic light emitting element in the third optical area;

an encapsulation layer disposed on the organic light emitting elements;

a first insulating layer disposed on the encapsulation layer;

a touch sensor disposed on the first insulating layer; and a second insulating layer disposed on the touch sensor, wherein a thickness of the first insulating layer in the third optical area is smaller than a thickness of the second insulating layer in the third optical area, and the thickness of the first insulating layer in the first optical area is smaller than the thickness of the second insulating layer in the first optical area, wherein the thickness of the first insulating layer disposed in the third optical area is greater than the thickness of the first insulating layer disposed in the first optical area, and the thickness of the second insulating layer disposed in the third optical area is greater than the thickness of the second insulating layer disposed in the first optical area, wherein the planarization layer is extended from the third optical area to the plurality of first light transmission areas of first optical area and disposed below the encapsulation layer, wherein the organic light emitting elements include an anode electrode, an emission layer, and a cathode electrode, and wherein the emission layer within a plurality of first transmission areas is separated from the emission layer within a plurality of third optical areas.

15. The display panel according to claim 14, wherein the thickness of the second insulating layer in the first optical area is greater than 2 times the thickness of the first insulating layer in the first optical area, and less than or equal to 2.5 times the thickness of the first insulating layer in the first optical area.

16. The display panel according to claim 14, wherein the thickness of the second insulating layer in the third optical area is 2 times the thickness of the first insulating layer in the third optical area.

17. The display panel according to claim 14, further comprising:

a second optical electronic device located under the display panel, wherein the display panel further includes a plurality of second light emitting areas, wherein a second optical area of the display panel overlapping the second optical electronic device comprises a plurality of second light transmission areas and the plurality of second light emitting areas, and wherein the third optical area is disposed between the first optical area and the second optical area.

18. A display panel comprising:

a substrate including a display comprising a first optical area overlapping a first optical electronic device located under the substrate, and a third optical area located outside of the first optical area; and a plurality of organic light emitting elements disposed over the substrate in the first optical area and the third optical area;

a driving transistor for driving an organic light emitting element of the plurality of organic light emitting elements in the third optical area;

a planarization layer between the driving transistor and the organic light emitting element in the third optical area;

an encapsulation layer disposed on at least one of the organic light emitting elements;

a first insulating layer disposed on the encapsulation layer;

a touch sensor disposed on the first insulating layer; and a second insulating layer disposed on the touch sensor, wherein respective thicknesses of the first insulating layer in the third optical area and the first optical area are not uniform, and respective thicknesses of the second insulating layer in the third optical area and the first optical area are not uniform to increase a transmittance of incident light over a predetermined wavelength, wherein the first optical area further includes a plurality of first light transmission areas, wherein the planarization layer is extended from the third optical area to the plurality of first light transmission areas of first optical area and disposed below the encapsulation layer, wherein the organic light emitting elements include an anode electrode, an emission layer, and a cathode electrode, and wherein the emission layer within a plurality of first transmission areas is separated from the emission layer within a plurality of third optical areas.

19. The display panel according to claim 18, further comprising:

a second optical electronic device located under the display panel, wherein a second optical area of the display panel overlapping the second optical electronic device comprises a plurality of second light transmission areas and a plurality of organic light emitting elements disposed over the substrate in the second optical area, and wherein the third optical area is disposed between the first optical area and the second optical area.

20. The display panel according to claim 19, wherein the thickness of the first insulating layer disposed in the third optical area is greater than a thickness of the first insulating layer disposed in the second optical area, and the thickness of the second insulating layer disposed in the third optical area is greater than a thickness of the second insulating layer disposed in the second optical area.

* * * * *